US010147585B2

(12) United States Patent
Okumura et al.

(10) Patent No.: US 10,147,585 B2
(45) Date of Patent: *Dec. 4, 2018

(54) PLASMA PROCESSING APPARATUS

(71) Applicant: Panasonic Corporation, Osaka (JP)

(72) Inventors: Tomohiro Okumura, Osaka (JP);
Hiroshi Kawaura, Kanagawa (JP);
Tetsuya Yukimoto, Chiba (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/247,439

(22) Filed: Apr. 8, 2014

(65) Prior Publication Data

US 2014/0220784 A1    Aug. 7, 2014

Related U.S. Application Data

(63) Continuation of application No. 13/661,118, filed on Oct. 26, 2012.

(30) Foreign Application Priority Data

Oct. 27, 2011  (JP) ................................. 2011-235766
Dec. 6, 2011   (JP) ................................. 2011-266589
(Continued)

(51) Int. Cl.
*H01J 37/32* (2006.01)
*H05H 1/30* (2006.01)
*H01L 21/3065* (2006.01)

(52) U.S. Cl.
CPC ...... *H01J 37/321* (2013.01); *H01J 37/32357* (2013.01); *H05H 1/30* (2013.01); *H01L 21/3065* (2013.01)

(58) Field of Classification Search
CPC . H01L 21/02252; H01L 39/2445; H05H 1/30; H01J 37/321; H01J 37/3211;
(Continued)

(56) References Cited

U.S. PATENT DOCUMENTS

| 4,266,113 A | 5/1981 | Denton et al. ........... 219/121.51 |
| 4,482,246 A | 11/1984 | Meyer et al. ................. 356/316 |

(Continued)

FOREIGN PATENT DOCUMENTS

| CN | 1416308 | 5/2003 |
| CN | 1614746 | 5/2005 |

(Continued)

OTHER PUBLICATIONS

English Translation of Chinese Search Report dated Feb. 4, 2015 for the related Chinese Patent Application No. 201210413158.2.
(Continued)

*Primary Examiner* — Aiden Lee
(74) *Attorney, Agent, or Firm* — Panasonic IP Management

(57) ABSTRACT

A plasma processing apparatus having a dielectric member that surrounds a circular chamber having a long shape and communicating with an opening portion having a long and linear shape, a gas supply pipe for introducing gas into an inside of the circular chamber, a coil provided in a vicinity of the circular chamber and having a long shape in parallel with a longitudinal direction of the opening portion, a high-frequency power supply connected to the coil, a base material mounting table that mounts a base material, and a moving mechanism that allows relative movement between the circular chamber and the base material mounting table in a perpendicular direction with respect to an longitudinal direction of the opening portion.

7 Claims, 26 Drawing Sheets

(30) Foreign Application Priority Data

Dec. 7, 2011 (JP) .................................. 2011-267960
Dec. 7, 2011 (JP) .................................. 2011-267961

(58) Field of Classification Search
CPC ........... H01J 37/32119; H01J 37/32128; H01J 37/32137; H01J 37/32146; H01J 37/32155; H01J 37/32165; H01J 37/32174; H01J 37/32183
See application file for complete search history.

(56) References Cited

U.S. PATENT DOCUMENTS

| | | | | |
|---|---|---|---|---|
| H0000566 | H | | 1/1989 | Nyaiesh et al. ............... 427/571 |
| 4,948,458 | A | | 8/1990 | Ogle |
| 5,146,137 | A | | 9/1992 | Gesche et al. ........... 315/111.21 |
| 5,558,722 | A | | 9/1996 | Okumura et al. |
| 5,679,167 | A | * | 10/1997 | Muehlberger ......... 118/723 DC |
| 5,684,581 | A | * | 11/1997 | French ..................... H05H 1/30 356/316 |
| 6,020,570 | A | | 2/2000 | Taki et al. |
| 6,054,669 | A | * | 4/2000 | Warren, Jr. .......... B23K 10/003 219/121.39 |
| 6,262,386 | B1 | | 7/2001 | Fornsel ..................... 219/121.52 |
| 6,265,690 | B1 | | 7/2001 | Fornsel et al. |
| 6,312,554 | B1 | * | 11/2001 | Ye ............................. 156/345.38 |
| 2001/0008229 | A1 | | 7/2001 | Selitser ..................... 219/121.52 |
| 2003/0111963 | A1 | | 6/2003 | Tolmachev et al. ..... 315/111.51 |
| 2004/0182517 | A1 | | 9/2004 | Lai et al. .................. 156/345.48 |
| 2004/0211760 | A1 | * | 10/2004 | Delzenne ............... B23K 10/00 219/121.44 |
| 2005/0040145 | A1 | | 2/2005 | Okumura et al. ........ 219/121.56 |
| 2005/0093460 | A1 | | 5/2005 | Kim et al. |
| 2007/0000878 | A1 | | 1/2007 | Fujita et al. ............. 219/121.11 |
| 2007/0137576 | A1 | | 6/2007 | Kurunczi et al. |
| 2007/0243338 | A1 | | 10/2007 | Aslami et al. ................ 427/569 |
| 2008/0023070 | A1 | | 1/2008 | Sinha ............................ 136/261 |
| 2008/0023653 | A1 | | 1/2008 | Lee et al. |
| 2009/0017601 | A1 | | 1/2009 | Jewett et al. ................. 438/478 |
| 2010/0066251 | A1 | | 3/2010 | Nakagami et al. |
| 2010/0297836 | A1 | | 11/2010 | Sasaki et al. |
| 2011/0045205 | A1 | | 2/2011 | Rostaing et al. |
| 2011/0259269 | A1 | | 10/2011 | Biloiu et al. |
| 2012/0058649 | A1 | * | 3/2012 | Okumura ................. H05H 1/28 438/798 |
| 2012/0261390 | A1 | | 10/2012 | Boulos et al. |
| 2013/0146564 | A1 | | 6/2013 | Okumura |
| 2014/0197136 | A1 | | 7/2014 | Nagorny et al. |

FOREIGN PATENT DOCUMENTS

| | | | |
|---|---|---|---|
| CN | 1638599 | 7/2005 | |
| JP | 61-068900 | 4/1986 | |
| JP | 03-079025 | 4/1991 | |
| JP | 04-284974 | 10/1992 | |
| JP | 06-163188 | 6/1994 | |
| JP | 08-083696 | 3/1996 | |
| JP | 08-118027 | 5/1996 | |
| JP | 10-223607 | 8/1998 | |
| JP | 11-040100 | 2/1999 | |
| JP | 11-040544 | 2/1999 | |
| JP | 11-251090 | 9/1999 | |
| JP | 2001-068298 | 3/2001 | |
| JP | 2002-500818 | 1/2002 | |
| JP | 2003-168595 | 6/2003 | |
| JP | 2003-249493 | 9/2003 | |
| JP | 2007-287452 | 11/2007 | |
| JP | 2007-287454 | 11/2007 | |
| JP | 2008-028360 | 2/2008 | |
| JP | 2008-053634 | 3/2008 | |
| JP | 2009-520324 | 5/2009 | |
| JP | 2009-158251 | 7/2009 | |
| JP | 2009-158491 | 7/2009 | |
| JP | 2009-545165 | 12/2009 | |
| JP | 2010-539336 | 12/2010 | |
| JP | 2013-120633 | 6/2013 | |
| JP | 2013-120684 | 6/2013 | |
| JP | 2013-120685 | 6/2013 | |
| JP | 2013-120686 | 6/2013 | |
| JP | 2013-120687 | 6/2013 | |
| WO | 20081065744 | 6/2008 | |
| WO | WO2008137433 | 11/2008 | ........... C23C 16/505 |

OTHER PUBLICATIONS

"Crystallization of Si in Millisecond Time Domain Induced by Thermal Plasma Jet Irradiation," Seiichiro Higashi et al., Japanese Journal of Applied Physics, vol. 45, No. 5B, pp. 4313-4320 (2006).
English Translation of Chinese Search Report dated Jul. 21, 2015 for the related Chinese Patent Application No. 201210413158.2.
Non-final office action of U.S. Appl. No. 13/661,118 dated Aug. 31, 2015.
Final office action of U.S. Appl. No. 13/661,118 dated Jan. 6, 2016.
Office Action dated May 19, 2016 and Supplemental Office Action dated Jun. 10, 2016 for the parent U.S. Appl. No. 13/661,118.

* cited by examiner

PLASMA PROCESSING APPARATUS

TECHNICAL FIELD

The present invention relates to a plasma processing apparatus and a plasma processing method. The invention relates to a plasma processing apparatus and a plasma processing method of a thermal plasma processing in which a base material is irradiated with thermal plasma so as to treat the base material, a low-temperature plasma processing in which a base material is irradiated with plasma from reaction gas or plasma and a reaction gas flow at the same time so as to treat the base material, and the like.

BACKGROUND ART

In the past, a semiconductor thin film such as polycrystalline silicon (hereinafter also referred to as "poly-Si") was widely used for thin film transistors (hereinafter also referred to as "TFT") or solar cells. Poly-Si TFT is widely used for, for example, a switching element that constitutes a pixel circuit such as a liquid crystal display apparatus, a liquid crystal projector, or an organic EL display apparatus, or a circuit element of a liquid crystal driver using the characteristics that poly-Si TFT can be manufactured on a transparent insulating substrate such as a glass substrate due to having particularly high carrier mobility.

As a method of manufacturing a high-performance TFT on a glass substrate, a manufacturing method termed a "high-temperature process" is generally used. Among TFT-manufacturing processes, a process in which the peak temperature is a high temperature of approximately 1000° C. is termed the "high-temperature process". The characteristics of the high-temperature process include a capability of forming a relatively favorable polycrystalline silicon film using the solid-phase growth of silicon, a capability of obtaining a favorable gate insulating layer using thermal oxidation of silicon, and a capability of forming an interface between pure polycrystalline silicon and the gate insulating layer. In the high-temperature process, a high-performance TFT having high mobility and high reliability can be stably manufactured due to the above characteristics.

On the other hand, in order to crystallize a silicon film using solid-phase growth in the high-temperature process, it is necessary to perform a thermal treatment at a temperature of approximately 600° C. for a long period of time of approximately 48 hours. The above process takes a significantly long process, and, in order to increase the throughput of the process, inevitably, there are problems in that a number of thermal treatment furnaces are required, and it is difficult to reduce the cost. Additionally, since there is no choice but to use quartz glass as the highly heat-resistant insulating substrate, the cost for a substrate is high, which does not make an increase in the size suitable.

Meanwhile, a technique for manufacturing a poly-Si TFT on a cheap large-area glass substrate by lowering the peak temperature in the process is termed a "low-temperature process". Among TFT-manufacturing processes, a process in which a poly-Si TFT is manufactured on a relatively cheap heat-resistant glass substrate under a temperature environment in which the peak temperature is approximately 600° C. or lower is generally termed the "low-temperature process". In the low-temperature process, a laser crystallization technique in which a silicon film is crystallized using a pulse laser having an extremely short oscillation time is widely used. Laser crystallization refers to a technique using a property of a silicon thin film in a process in which the silicon thin film on a substrate is irradiated with a high-output pulse laser ray so as to be instantly melted, and crystallized in the process of solidifying.

However, the laser crystallization technique has several large problems. One of problems is a large number of trapping levels that are locally present in a polysilicon film formed using a laser crystallization technique. Due to the presence of the trapping levels, carriers which are originally supposed to move through an active layer are trapped by application of a voltage, and thus may not contribute to electrical conduction, which results in the adverse influences of a decrease in the mobility of the TFT and an increase in the threshold voltage.

Furthermore, due to limitations of the laser output, there is another problem in that the size of the glass substrate is limited. In order to improve the throughput of the laser crystallization process, it is necessary to increase the area that can be crystallized at a time. However, since there is a limitation on the current laser output, in a case in which the crystallization technique is employed in a large-scale substrate such as a $7^{th}$ generation (1800 mm×2100 mm), a long period of time is required to crystallize a single substrate.

In addition, in the laser crystallization technique, generally, a linearly-formed laser is used, and crystallization is performed by scanning with the linearly-formed laser. This line beam is shorter than the width of the substrate due to a limitation in laser output, and, in order to crystallize the entire surface of the substrate, it is necessary to scan the laser over several times. As a result, joint regions of the line beam are generated in the substrate, and there are regions which are scanned twice. These regions have significantly different crystallinity from the regions crystallized by scanning once. Therefore, element characteristics are significantly different at both regions, which causes a large variation in devices.

Finally, since a laser crystallization apparatus has a complex apparatus configuration and a large cost for consumable components, there are problems of large apparatus costs and running costs. As a result, a TFT for which a polysilicon film crystallized using the laser crystallization apparatus is used becomes an element having a high manufacturing cost.

In order to overcome the problems of the limitation on the size of the substrate and the large apparatus costs, a crystallization technique termed a "thermal plasma jet crystallization method" is being studied (for example, refer to Non Patent Document 1). Hereinafter, this technique will be described simply. A tungsten (W) anode and a water-cooled copper (Cu) cathode are disposed opposite to each other, and an arc discharge is generated between both electrodes when a DC voltage is applied. When argon gas is made to flow between the electrodes under atmospheric pressure, thermal plasma is ejected from an ejection hole opened in the copper cathode.

The thermal plasma refers to thermal equilibrium plasma, and is an ultra high-temperature heat source in which ions, electrons, neutral atoms, and the like have substantially the same temperature which is approximately 10000 K. Due to the above fact, the thermal plasma can easily heat matter to a high temperature, and an amorphous silicon (hereinafter also referred to as "a-Si") film can be crystallized by scanning a substrate having the amorphous silicon film deposited thereon against the front surface of ultra high-temperature thermal plasma at a high rate.

As such, since the apparatus configuration is extremely simple, and crystallization is achieved under atmospheric pressure in the process, it is not necessary to cover the apparatus with an expensive member such as a sealed chamber, and a significant decrease in the apparatus costs can be expected. In addition, since utilities necessary for crystallization are argon gas, electric power, and cooling water, the crystallization technique also has a low running cost.

FIG. 16 is a schematic diagram for explaining the crystallization method of a semiconductor film in which thermal plasma is used. In FIG. 16, a thermal plasma-generating apparatus 31 is configured to have an anode 32 and a cathode 33 which is disposed opposite to the anode 32 with a predetermined distance therebetween. The anode 32 is constituted by, for example, a conductor such as tungsten. The cathode 33 is constituted by, for example, a conductor such as copper. In addition, the cathode 33 is formed to be hollow, and is configured to allow water to pass through the hollow portion so as to make cooling possible. In addition, an ejection hole (nozzle) 34 is provided in the cathode 33. When a direct (DC) voltage is applied between the anode 32 and the cathode 33, an arc discharge is generated between both electrodes. When gas such as argon gas is made to flow between the anode 32 and the cathode 33 under the atmosphere in the above state, it is possible to eject thermal plasma 35 from the ejection hole 34. Here, the "thermal plasma" refers to thermal equilibrium plasma, and is an ultra high-temperature heat source in which ions, electrons, neutral atoms, and the like have substantially the same temperature which is approximately 10000 K.

The thermal plasma can be used for a thermal treatment for crystallization of a semiconductor film. Specifically, a semiconductor film 37 (for example, an amorphous silicon film) is formed on a substrate 36, and the thermal plasma (thermal plasma jet) 35 is made to spray the semiconductor film 37. At this time, the thermal plasma 35 is made to spray the semiconductor film 37 while relatively moving along the first axis (the horizontal direction in the example shown in the drawing) that is parallel to the surface of the semiconductor film 37. That is, the thermal plasma 35 is made to spray the semiconductor film 37 while scanning in the first axial direction.

Here, the "relatively moving" means that the semiconductor film 37 (and the substrate 36 that supports the semiconductor film) and the thermal plasma 35 are made to move relatively, which includes a case in which only one of both is made to move and a case in which both are made to move. Using the scanning of the thermal plasma 35, the semiconductor film 37 is heated due to a high temperature of the thermal plasma 35, and the crystallized semiconductor film 38 (a polysilicon film in the present example) is obtained (for example, refer to Patent Document 1).

FIG. 17 is a conceptual view showing the relationship between the depth from the outermost surface and the temperature. As shown in FIG. 17, it is possible to treat only the vicinity of the surface at a high temperature by moving the thermal plasma 35 at a high rate. Since the heated regions rapidly cool after the thermal plasma 35 passes through, the vicinity of the surface remains at a high temperature for an extremely short period of time.

The thermal plasma is generally generated in dotted regions. The thermal plasma is maintained using thermionic emission from the anode 32. The thermionic emission becomes more active at locations having a high plasma density, and therefore a positive feedback is applied, and the plasma density gradually increases. That is, the arc discharge is generated intensely at one point in the anode, and the thermal plasma is generated in dotted regions.

In a case in which it is necessary to uniformly treat a tabular base material for crystallization of a semiconductor film, and the like, it is necessary to scan dotted thermal plasma across the entire base material. However, in order to build a process in which the number of times of scanning is reduced so that a treatment can be performed within a shorter period of time, it is effective to widen the irradiation region of the thermal plasma. Therefore, techniques that generate thermal plasma in a large area have thus far been being studied.

For example, a method is disclosed in which broadening gas for widening a plasma jet is ejected to the plasma jet sprayed from an external nozzle of a plasma torch from two places at the same time in a direction that intersects with the central axis line of the external nozzle so as to widen the plasma jet (for example, refer to Patent Document 2). Alternatively, a method is disclosed in which a plasma nozzle characterized by the opening portion of the nozzle path inclined at a predetermined angle with respect to the core of the nozzle path is provided, and a casing or part of the casing that constitutes the nozzle path is rotated around the longitudinal core at a high rate, thereby passing the plasma nozzle through a workpiece (for example, refer to Patent Document 3). In addition, an apparatus provided with a rotary head having at least one eccentrically disposed plasma nozzle is disclosed (for example, refer to Patent Document 4).

Meanwhile, although not aiming to treat a large area within a short period of time, a high-speed gas shield arc welding method characterized in that band-shaped electrodes are used, and disposed so that the width direction forms the welding line direction, and welding is performed is disclosed as a welding method using the thermal plasma (for example, refer to Patent Document 5).

In addition, an induction coupling-type plasma torch forming a linear thin and long shape for which a flat rectangular insulating material is used is disclosed (for example, refer to Patent Document 6).

Meanwhile, a method of generating thin and long linear plasma in which long electrodes are used is disclosed (for example, refer to Patent Document 7). Although described to generate thermal plasma, the method is to generate low-temperature plasma, and is not a configuration appropriate for a thermal treatment. If thermal plasma is generated, since the method is a capacity coupling-type in which electrodes are used, it is assumed that an arc discharge is focused at one place, and it is difficult to generate uniform thermal plasma in the longitudinal direction. Meanwhile, as a low-temperature plasma processing apparatus, an apparatus with which a plasma processing such as etching or film formation is possible by plasmatizing etching gas or chemical vapor deposition (CVD) gas is used.

In addition, a method in which long plasma is generated using a micro strip line is disclosed (for example, refer to Patent Document 8). In this configuration, since the chamber wall surface into which plasma comes into contact may not be completely cooled (not surrounded by a water cooling path), it is considered that the configuration may not work as a thermal plasma source.

In addition, an apparatus in which a plurality of discharge electrodes are arrayed linearly so as to form a linear long plasma torch (for example, refer to Patent Document 9).

Additionally, an induction coupling-type plasma apparatus having a dielectric cylinder disposed in the inside of a chamber (for example, refer to Patent Document 10) is disclosed.

CITATION LIST

Patent Literature

PTL 1
Japanese Patent Application Laid-Open No. 2008-53634
PTL 2
Japanese Patent Application Laid-Open No. 08-118027

PTL 3
Japanese Patent Application Laid-Open No. 2001-68298
PTL 4
Published Japanese Translation of PCT Patent Application No. 2002-500818
PTL 5
Japanese Patent Application Laid-Open No. 04-284974
PTL 6
Published Japanese Translation of PCT Patent Application No. 2009-545165
PTL 7
Japanese Patent Application Laid-Open No. 2007-287454
PTL 8
Published Japanese Translation of PCT Patent Application No. 2010-539336
PTL 9
Japanese Patent Application Laid-Open No. 2009-158251
PTL 10
Japanese Patent Application Laid-Open No. 2003-249493

Non Patent Literature

NPL 1
S. Higashi, H. Kaku, T. Okada, H. Murakami and S. Miyazaki, "Crystallization of Si in Millisecond Time Domain Induced by Thermal Plasma Jet Irradiation" Jpn. J. Appl. Phys. 45 (2006) pp. 4313 to 4320

SUMMARY OF INVENTION

Technical Problem

However, the techniques of the related art for generating thermal plasma in a large area were not effective for use in a case where the vicinity of the surface of a base material is treated at a high temperature only for an extremely short period of time such as crystallization of a semiconductor.

In the technique for generating thermal plasma in a large area which is described in Patent Document 2 in the examples of the related art, widening is achieved, but the temperature distribution becomes 100° C. or higher in the widened regions, and a uniform thermal treatment may not be realized.

In addition, the techniques for generating thermal plasma in a large area which are described in Patent Documents 3 and 4 in the examples of the related art are essentially to oscillate thermal plasma. Therefore, since the substantial thermal treatment time becomes short compared to a case in which thermal plasma is scanned without rotating the casing or the rotary head, the time for treating a large area does not become particularly short. In addition, for a uniform treatment, it is necessary to sufficiently increase the rotation rate compared to the scanning rate, and there is no way of avoiding the configuration of the nozzle becoming complex.

In addition, the technique described in Patent Document 5 in the examples of the related art is a welding technique, which is not a configuration for a uniform treatment of a large area. Even when the technique is applied to use of a large area treatment, in this configuration, since the dotted arcs vibrate along the band-shaped electrodes, uniform plasma is generated in a time-average manner; however, non-uniform plasma is generated instantly. Therefore, the technique may not be applied to a uniform treatment of a large area.

In addition, unlike the technique described in Non Patent Document 1 or Patent Document 1 in which a DC arc discharge is used, the technique described in Patent Document 6 in the examples of the related art has a characteristic of using an induction coupling-type high-frequency plasma torch. Since the technique is an electrodeless discharge, the technique has advantages of excellent stability of thermal plasma (small variation over time) and little contamination of electrode materials into the base materials.

In the induction coupling-type plasma torch, a method in which an insulating material configures double tubes, and a cooling medium is made to flow between the double tubes in order to protect the insulating material from high-temperature plasma is generally employed. However, in the technique described in Patent Document 6 in the examples of the related art, since the insulating material forms a flat rectangular shape, it is not possible for a sufficient flux of a cooling medium to flow simply by configuring double tubes using the insulating material. This is because the insulating material generally has a poor mechanical strength compared to metal, and, when the insulating material is made to be long in the longitudinal direction, it becomes impossible to increase the internal pressure of the double tubes. Therefore, there is a limitation on a uniform treatment of a large area.

Meanwhile, even for dotted thermal plasma, when the diameter is large, the number of times of scanning decreases during a large area treatment, and therefore a treatment can be carried out within a short period of time depending on use. However, when the diameter of the thermal plasma is large, since the time in which the thermal plasma passes above the base material during scanning substantially increases, it is not possible to treat only the vicinity of the surface of the base material at a high temperature only for an extremely short period of time, the base material reaches a high temperature even in a very deep region, and there are cases in which a disadvantage, for example, cracking or peeling of the glass substrate occurs.

In addition, the technique described in Patent Document 9 in the examples of the related art has disadvantages of poor stability of thermal plasma (large variation over time) and much contamination of the electrode materials in to the base material compared to the induction coupling-type high-frequency plasma torch described above.

In addition, in an induction coupling-type high-frequency plasma torch as shown in the technique described in Patent Document 6 in the examples of the related art, the cylindrical plasma processing apparatus was put into practical use for analysis or spraying, but there were disadvantages that the plasma generation efficiency was poor, and the discharge became unstable when the gas flux increased.

The invention has been made in consideration of the above problems, and relates to a low-temperature plasma processing of a base material when the vicinity of the surface of the base material is uniformly treated thermally only for a short period of time, or the base material is irradiated with plasma from reaction gas or plasma and a reaction gas flow at the same time.

An object of the invention is to provide a plasma processing apparatus and a plasma processing method which can generate plasma stably and efficiently, and can efficiently treat all of the desired regions to be treated of a base material within a short period of time.

Solution to Problem

A first aspect of the invention is a plasma processing apparatus having a circular chamber including an opening portion which serves as a plasma ejection port surrounded by a dielectric member, a gas supply pipe for introducing gas into the inside of the chamber, a coil provided in the vicinity of the chamber, a high-frequency power supply connected to the coil, and a base material mounting table. In this case, the chamber has a hollow outside dielectric block formed of a dielectric member having a plasma generation region in the inside and a plasma ejection port at the bottom end and an inside dielectric block formed of a dielectric member having an inside dielectric block main body having a gas pipe that communicates to the outside so that gas can be supplied to the inside disposed on the inside of the top end of the outside dielectric block and a protrusion body projecting toward the bottom end of the chamber from the central portion of the inside dielectric block main body, and, when the inside dielectric block is disposed in the inside of the outside dielectric block, the plasma generation region is preferably formed between the inside side surface of the outside dielectric block and the side surface of the inside dielectric block.

A second aspect of the invention is a plasma processing apparatus in which the chamber has a long shape, the outside dielectric block has a flange portion extending from the opening portion at the bottom end of the outside dielectric block, the bottom end of the protrusion body of the inside dielectric block extends to the opening portion of the outside dielectric block, and forms the bottom portion of the chamber with the flange portion, and a plasma ejection port is provided in a long line shape at one of the long sides of the chamber in a bottom surface view.

A third aspect of the invention is a plasma processing apparatus in which the inside dielectric block has a conductor member in the inside.

A fourth aspect of the invention is a plasma processing apparatus having a base material mounting table, a chamber disposed above the base material mounting table, a gas supply pipe that introduces gas into an inside of the chamber, and a coil disposed near the chamber, in which a plurality of coil pieces that is shorter than the outer peripheral length of the chamber mutually overlaps a part of the neighboring coil pieces so as to surround the outer periphery of the chamber as the coil.

A fifth aspect of the invention is a plasma processing method including ejecting gas toward a base material from an opening portion that communicates to a circular chamber while the gas is supplied into the circular chamber surrounded by a dielectric member, and supplying a high-frequency power to a coil, generating a high-frequency electromagnetic field in the circular chamber so as to generate plasma and treating the surface of the base material.

Advantageous Effects of Invention

According to the invention, it is possible to generate plasma stably and efficiently, and to efficiently treat all of the desired regions to be treated of the base material within a short period of time.

DESCRIPTION OF EMBODIMENTS

Hereinafter, the embodiments A to D will be described with reference to the accompanying drawings.

[Embodiment A]

(Embodiment A1)

Figure 1A:
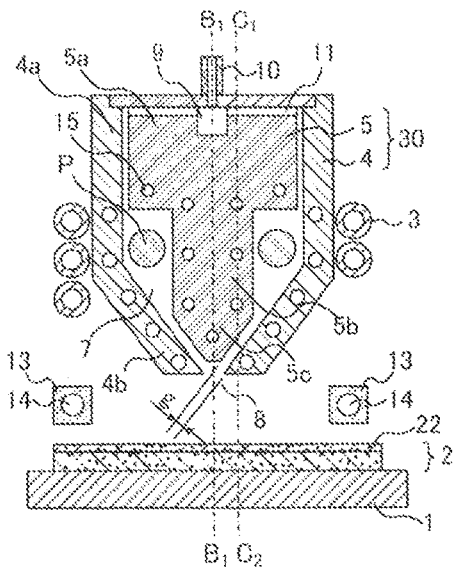
FIGS. 1A to 1C are $A_1$-$A_2$ cross-sectional view, $B_1$-$B_2$ cross-sectional view, and $C_1$-$C_2$ cross-sectional view of a plasma processing apparatus according to an embodiment A1 respectively.

FIG. 1A is a cross-sectional view of an induction coupling-type plasma torch unit (hereinafter also referred to as the "unit T") of a plasma processing apparatus according to an embodiment 1 cut at a surface that is perpendicular to a base material 2. FIG. 1A shows a state of the plasma processing apparatus in use in which the base material 2 is disposed on a base material mounting table 1, and a plasma processing is performed on a thin film 22 on the surface of the base material 2.

Figure 1B:
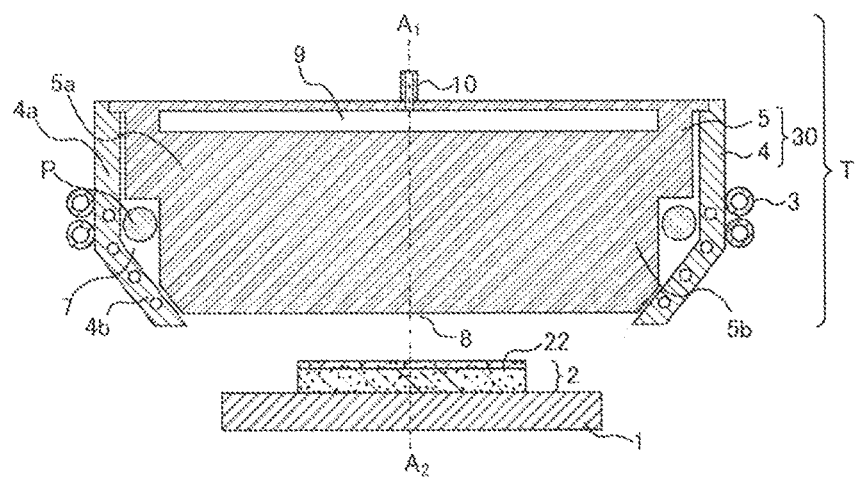
Figure 1C:
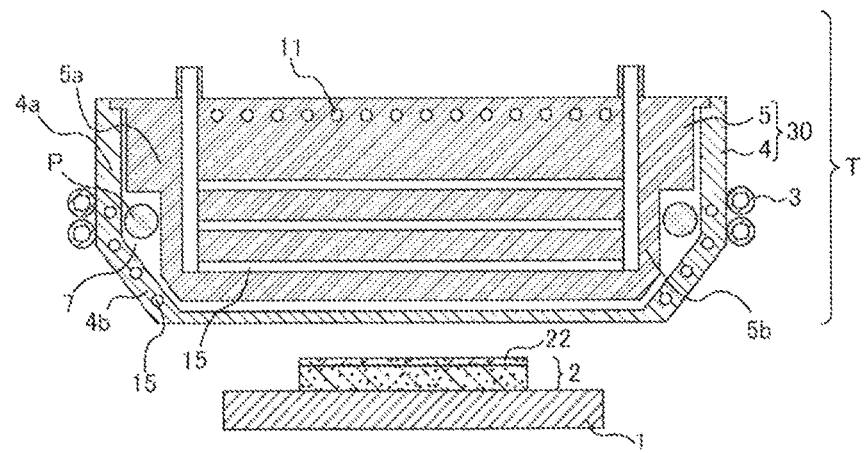
Figure 2:
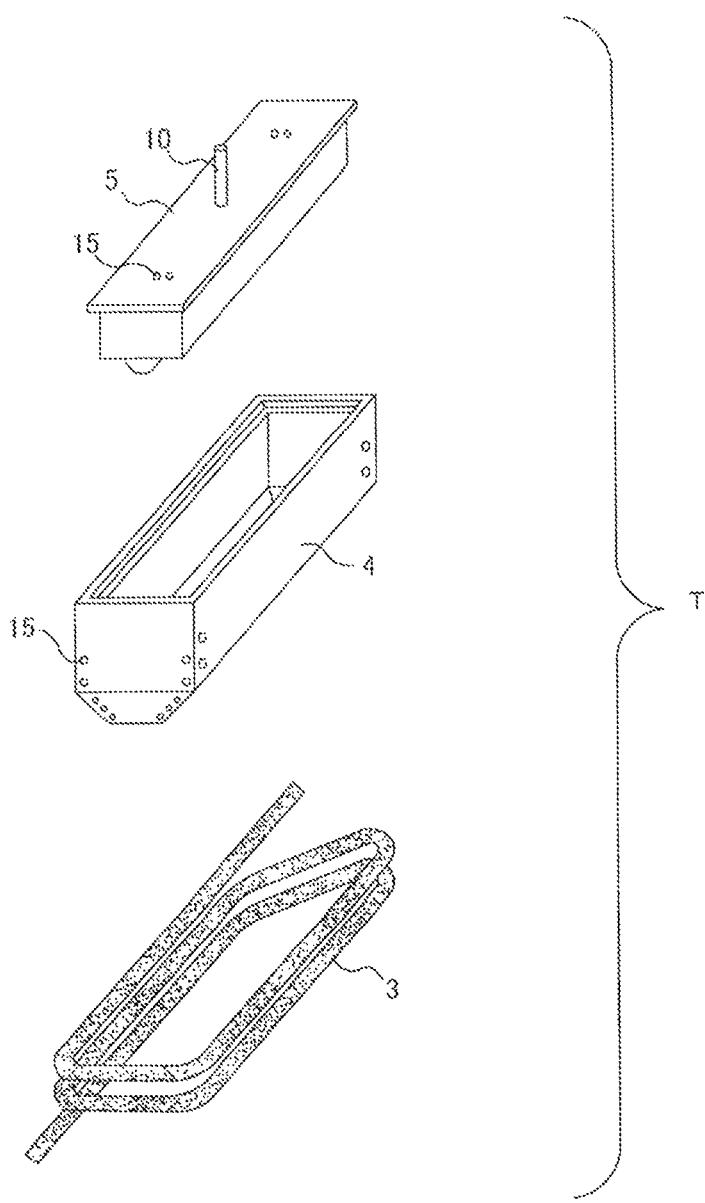
FIG. 2 is an exploded perspective view of the plasma processing apparatus according to the embodiment A1.

FIG. 1B is a cross-sectional view cut along the dotted line $B_1$-$B_2$ in FIG. 1A. FIG. 1C is a cross-sectional view cut along the dotted line $C_1$-$C_2$ in FIG. 1A. Meanwhile, FIG. 1A is a cross-sectional view cut along the dotted line $A_1$-$A_2$ in FIG. 1B. In addition, FIG. 2 is an exploded perspective view of the induction coupling-type plasma torch unit T shown in FIGS. 1A to 1C, which shows an array of perspective views of (a part of) the respective components.

The plasma processing apparatus has the base material mounting table 1, a chamber 30 which is disposed above the base material mounting table 1, a gas supply pipe 10 that introduces gas in the inside 7 of the chamber 30, and a solenoid coil 3 disposed at the outer circumstance of the chamber 30. The chamber 30 has a hollow outside dielectric block 4 formed of a dielectric member having a plasma generation region in the inside 7 and the plasma ejection port 8 at the bottom end and an inside dielectric block 5 formed of a dielectric member having an inside dielectric block main body 5a having a gas pipe (manifold) 9 that communicates to the outside so that gas can be supplied to the inside disposed on the inside of the top end of the outside dielectric block 4 and a protrusion body 5b projecting toward the bottom end of the chamber 30 from the central portion of the inside dielectric block main body 5a.

As shown in FIG. 1B, the chamber 30 preferably has a long shape. In addition, the chamber preferably further has a moving mechanism which enables the chamber 30 and the base material mounting table 1 to relatively move perpendicularly with respect to the longitudinal direction of the plasma ejection port 8. This is because, when the plasma ejection port 8 has a long linear shape, the size of the plasma processing apparatus can be decreased by performing a treatment while the chamber 30 and the base material mounting table 1 are relatively moved perpendicularly with respect to the longitudinal direction in a process of a plasma processing. In addition, since it is possible to perform a plasma processing of a large-scale substrate and the like within a short period of time.

The outside dielectric block 4 preferably has a taper portion 4b having the diameter narrowing toward the plasma ejection port. This is because it is possible to suppress the fluctuation of plasma, and generate more stable plasma. The plasma ejection port 8 is preferably formed at the bottom end of the taper portion 4b into a long linear shape in parallel with the longitudinal direction of the chamber 30.

As shown in FIG. 1C, a dielectric tube which forms a cooling medium path 15 in the inside is preferably joined to the outside dielectric block 4 in parallel with the longitudinal direction of the plasma ejection port 8.

This is because it becomes possible to cool the induction coupling-type plasma torch unit T by letting a cooling medium such as water flow.

As shown in FIG. 2, when the inside dielectric block 5 is disposed in the inside of the outside dielectric block 4, a generation region of plasma P is formed in a circular shape as shown in FIG. 1A between the inside side surface of the outside dielectric block 4 and the inside side surface of the inside dielectric block 5. Here, the "circular shape" refers to a shape forming a series of tied laces, and is not limited to a ring shape.

As shown in FIG. 1A, the gap g of a path communicating the plasma generation region and the plasma ejection port which is formed at a gap between the inside dielectric block 5 and the outside dielectric block 4 is preferably 1 mm or less.

The inside dielectric block 5 preferably has a taper portion 5c formed into a taper shape whose diameter gradually narrows toward the plasma ejection port 8 at the front end of the protrusion body 5b. In addition, the width of the path communicating the plasma generation region and the plasma ejection port which is formed at a gap between the inside dielectric block 5 and the outside dielectric block 4 is preferably the same as the width of the plasma ejection port. This is because it is possible to suppress fluctuation of plasma and generate more stable plasma.

In FIGS. 1A to 1C, the base material 2 is mounted on the base material mounting table 1. In the induction coupling-type plasma torch unit T, the solenoid coil 3 made of a conductor is disposed in the vicinity of the outside dielectric block 4 and the inside dielectric block 5. The long chamber 30 made of a dielectric material is demarcated by a space surrounded by the outside dielectric block 4 and the inside dielectric block 5 (the inside 7 of the chamber 30). The inner wall surface of the chamber 30 near the solenoid coil 3 is a curved surface in parallel with the solenoid coil 3.

The above configuration makes the distance from the solenoid coil 3 to the chamber 30 the same at an arbitrary portion of the solenoid coil 3. As a result, it becomes possible to generate induction coupling plasma using a small high-frequency power, and plasma can be efficiently generated.

The induction coupling-type plasma torch unit T is preferably surrounded by a wholly grounded shielding member (not shown) made of a conductor. This is because the leakage (noise) of high frequencies can be effectively prevented. In addition, since it is possible to prevent an abnormal discharge and the like which are not preferable.

The inside 7 of the chamber 30 is surrounded by an outer wall surface of the inside dielectric block 5 which serves as the inside dielectric block and the inner wall surface of the outside dielectric block 4 which serves as the outside dielectric block into which the inside dielectric block is inserted. That is, the entire chamber 30 is surrounded by a dielectric material. In addition, the inside 7 of the chamber 30 is circular.

The embodiment A1 exemplifies a racetrack-form (a shape of a series of tied laces in which straight portions constituted by two long sides and rings, ovals, or straight lines forming two short sides at both ends of the straight portions are coupled) long chamber 30. Plasma P generated in the inside 7 of the chamber 30 is ejected toward the base material 2 from the plasma ejection port 8 which acts as a slit-shaped opening portion in the chamber 30. In addition, the longitudinal direction of the chamber 30 and the longitudinal direction of the plasma ejection port 8 are disposed in parallel.

A plasma gas manifold 9 is provided in the inside of the inside dielectric block 5. Gas supplied to the plasma gas manifold 9 from the plasma gas supply pipe 10 is introduced into the inside 7 of the long chamber through a plasma gas supply hole 11 (penetrating hole) which acts as a gas introduction portion provided in the inside dielectric block 5. The above configuration can easily realize a uniform gas flow in the longitudinal direction. The flux of gas introduced into the plasma gas supply pipe 10 is controlled using a flux control apparatus such as a mass flow controller provided upstream.

A plurality of the plasma gas supply holes 11 having a round hole shape is provided in the longitudinal direction, but the plasma gas supply hole may be a long slit.

In addition, a shielding gas nozzle 13 is disposed as a shielding gas supply opening at a portion near the base material mounting table 1, and a shielding gas manifold 14 is preferably provided in the shielding gas nozzle. As such, a two-path gas introduction system is preferably provided. This is because it becomes possible to decrease incorporation of gas which is not necessary for or has an adverse influence on the treatment, such as oxygen and carbon dioxide in the atmosphere, into plasma-irradiating surfaces by supplying shielding gas separately from plasma gas which is suitable for generation of plasma.

Meanwhile, the shielding gas supply opening may be a slit having a long shape in parallel with the longitudinal direction of the plasma ejection port 8, or a number of holes arrayed in parallel with the longitudinal direction of the plasma ejection port 8.

The solenoid coil 3 is made of a hollow copper tube, and preferably forms a cooling medium path in the inside. This is because it becomes possible to cool the chamber 30 by letting a cooling medium such as water flow. In addition, the cooling medium paths 15 are preferably provided in the outside dielectric block 4 and the inside dielectric block 5 in parallel with the longitudinal direction of the plasma ejection port 8. In addition, the cooling medium paths 15 are preferably provided in the outside dielectric block 4 perpendicularly with respect to the longitudinal direction of the plasma ejection port 8. As shown in FIG. 1C, the cooling medium paths 15 stereoscopically intersect with each other, and supply and drain a cooling medium from and to the outside.

In addition, as shown in FIG. 1C, in the inside dielectric block 5, the cooling medium paths are converged and bundled, and a cooling medium is supplied from and drained to the outside. Since the cooling medium paths are round in the cross section, it is difficult for the component members to deform due to the internal pressure when a large amount of a cooling medium flows. That is, compared to the case of the technique described in Patent Document 6 in the examples of the related art in which cooling is performed in a double tube configuration, in the embodiment, it is possible to let a far larger amount of a cooling medium flow, and to effectively cool the chamber 30.

The rectangular slit-shaped plasma ejection port 8 is provided, and the base material mounting table 1 (or the base material 2 on the base material mounting table 1) is disposed opposite to the plasma ejection port 8. In this state, gas is supplied to the inside 7 of the long chamber 30. At the same time, a high-frequency power is supplied to the solenoid coil 3 from a high-frequency power supply (not shown) while gas is ejected toward the base material 2 from the plasma ejection port 8. Thereby, the plasma P is generated in the inside 7 of the chamber 30, and the base material 2 is irradiated with the plasma from the plasma ejection port 8 so that a plasma processing can be performed on a thin film 22 on the base material 2. The base material 2 is preferably treated by relatively moving the long chamber and the base material mounting table 1 perpendicularly with respect to the longitudinal direction of the plasma ejection port 8. That is, the induction coupling-type plasma torch unit T or the base material mounting table 1 is preferably moved in the horizontal direction in FIG. 1A and in the perpendicular direction to the paper surface of FIGS. 1B and 1C. This is because it is possible to perform a treatment of a large-scale substrate or the like within a short period of time without increasing the size of the plasma processing apparatus.

A variety of gases can be used as the gas supplied into the long chamber with no particular limitations. An inert gas-dominant gas is desirable in consideration of the safety and ignition properties of plasma, the service life of members exposed to plasma, and the like. Among the above, argon (Ar) gas is typically used. In a case in which plasma is generated using only Ar, the plasma reaches a significantly high temperature (10,000 K or higher).

Meanwhile, in the configuration, since the length of the plasma ejection port 8 in the longitudinal direction is equal to or larger than the width of the base material 2, it is possible to treat all of a thin film 22 in the vicinity of the surface of the base material 2 with a single round of scanning (a relative movement of the induction coupling-type plasma torch unit T and the base material mounting table 1).

In such a plasma processing apparatus, Ar gas or a gas mixture ($Ar+H_2$) is continuously supplied into the long chamber from the gas ejection port, and gas is ejected from the plasma ejection port 8 toward the base material 2. At the same time, a high-frequency electromagnetic field is generated in the inside 7 of the long chamber by supplying a high-frequency electric power of 13.56 MHz to the solenoid coil 3 from the (not shown) high-frequency power supply. Thereby, plasma P is generated, and a thermal treatment such as crystallization of a semiconductor film can be performed by irradiating and scanning plasma to the base material 2 from the plasma ejection port 8.

Appropriate conditions for generation of plasma are the distance between the plasma ejection port 8 and the base material 2=3 mm to 50 mm, scanning rate=50 mm/s to 3000 mm/s, the total flux of plasma=1 SLM to 100 SLM, the concentration of $H_2$ in the gas mixture (Ar+$H_2$)=0% to 10%, shielding gas ($N_2$) flux: 1 SLM to 100 SLM, and high-frequency electric power=approximately 0.5 kW to 10 kW. However, among the above various amounts, the gas flux and the electric power are values per the length of the plasma ejection port 8 of 100 mm. This is because it is considered that it is appropriate to inject the amounts proportionate to the length of the plasma ejection port 8 as the parameters of the gas flux, the electric power, or the like.

As such, the long chamber and the base material mounting table 1 relatively move perpendicularly with respect to the longitudinal direction of the plasma ejection port 8 while the longitudinal direction of the plasma ejection port 8 and the base material mounting table 1 are disposed in parallel. Therefore, it is possible to configure the apparatus so that the length of plasma to be generated and the treatment length of the base material 2 become almost the same.

In addition, in the embodiment A1, the inside 7 of the long chamber 30 is circular. In addition, the gap (the gap g in FIG. 1A) of the path communicating the chamber 30 and the plasma ejection port 8 which serves as an opening portion is set to 0.5 mm. The effects of the above structure of the long chamber 30 will be described hereinafter.

Patent Document 6 shown in the examples of the related art does not disclose the structure of the inside of the plasma torch in detail. However, similarly to an ordinary cylindrical induction coupling-type plasma torch, the inside of the plasma torch is assumed to be a loaf of space having a cuboid shape. When induction coupling-type plasma is generated in such a space under atmospheric pressure, toric (doughnut-shaped) plasma is liable to be generated.

That is, since toric plasma is generated in the cuboid-shaped chamber, plasma having an extremely high density is generated at only a part in the chamber, and it is difficult to perform a uniform treatment in the longitudinal direction. Meanwhile, in the embodiment A1, since a long circular chamber 30 is configured, racetrack-form long and thin plasma is generated along the shape of the chamber. Therefore, compared to the examples of the related art, it is possible to perform a significantly uniform treatment in the longitudinal direction in the embodiment A1. In addition, since the high-frequency electric power exerting per unit volume increases due to the volume of the chamber 30 becoming small compared to the examples of the related art, the plasma generation efficiency improves.

In addition, in an ordinary induction coupling-type plasma torch of the related art, there was a problem in that, when the gas flux increases, a discharge becomes unstable. Refer to, for example, Hironobu Yabuta et. al., "Desigh and evaluation of dual inlet ICP torch for low gas consumption", journal of Analytical Atomic Spectrometry, 17 (2002), pp. 1090 to 1095.

This is considered to be because, when circular plasma fluctuates in the chamber, the distance between the circular plasma and the coil becomes excessively large in areas in which gas does not flow such that induction coupling may not be maintained, and the plasma is lost. Meanwhile, in the embodiment A1, the gap g of the path communicating the chamber 30 and the plasma ejection port 8 which serves as an opening portion is configured to be as extremely narrow as 0.5 mm. Therefore, the circular plasma P may not intrude into the path, and remains in the inside 7 (a region on the upstream side of the path) of the chamber 30. Therefore, even when the gas flux increases, fluctuation of the circular plasma P does not occur, and the long circular plasma P is maintained extremely stably. Therefore, compared to the examples of the related art, the embodiment A1 enables significantly stabilized generation of plasma.

Meanwhile, as a result of detailed studies regarding the gap g of the path communicating the chamber 30 and the plasma ejection port 8 which serves as an opening portion, it was found that fluctuation of the circular plasma P can be suppressed in a case in which the gap g is 1 mm or less. When the gap g is too small, the influence of product processing or assembly precision in the longitudinal direction increases, and the plasma flow which passes through the path and reaches the base material 2 is weakened, and therefore the gap is desirably configured to be 0.1 mm or more, and preferably 0.3 mm or more.

(Plasma Processing Method)

Next, a plasma processing method using the plasma processing apparatus according to the embodiment A1 will be described. The plasma processing method has a process in which gas is ejected toward a base material from an opening portion that communicates to a circular chamber while the gas is supplied into the circular chamber surrounded by a dielectric member, and a high-frequency power is supplied to a coil, thereby generating a high-frequency electromagnetic field in the circular chamber so as to generate plasma and treat the surface of the base material. Hereinafter, the plasma processing method will be described in detail.

(a) Firstly, the plasma processing apparatus as shown in FIGS. 1A to 1C is prepared.

(b) Next, gas is injected from the gas supply pipe 10. In addition, the gas is introduced into the inside 7 of the chamber 30 through a gas pipe 9. As the gas supplied into the chamber 30, a variety of gases can be used. When the safety and ignition properties of plasma, the service life of members exposed to plasma, and the like are taken into account, the gas desirably includes mainly an inert gas. For example, argon (Ar) gas or a gas mixture (Ar+$H_2$) can be used. Among the above, Ar gas is preferable. Meanwhile, in a case in which plasma is generated using only Ar gas, the plasma reaches a significantly high temperature (10,000 K or higher).

(c) High-frequency electric power of 13.56 MHz is supplied to the solenoid coil 3 disposed at the outer periphery of the chamber 30. In addition, a high-frequency electromagnetic field is generated in the chamber 30. In addition, plasma is generated between the inside side surface of the outside dielectric block 4 and the side surface of the inside dielectric block 5 in the chamber 30. Meanwhile, the process (c) may be performed at the same time as the process (b), but is preferably performed after the process (b).

(d) Meanwhile, the base material 2 is prepared, and the base material 2 is disposed on the base material mounting table 1 of FIG. 1A. The process (d) is preferably performed at a location away from the chamber 30, for example, at the side of the chamber 30, or the like.

(e) The chamber 30 is disposed above the base material 2, the base material 2 is irradiated with the plasma generated in the inside 7 of the chamber 30 from the plasma ejection port 8. In addition, a plasma processing is performed on the surface of the base material 2 using the plasma.

(f) The base material 2 and the chamber 30 are relatively moved perpendicularly with respect to the longitudinal direction of the plasma ejection port 8, and the base material 2 is scanned using the chamber 30. The process (f) may be performed at the same time as the process (e), but the chamber 30 is preferably scanned over the base material 2 when the moving rate of the chamber 30 becomes constant.

Using the above processes, a plasma processing can be performed on the thin film 22 on the base material 2. In addition, it is possible to perform a plasma processing such as a thermal treatment, thermal spraying, film formation, and etching by irradiating plasma to the base material 2 from the plasma ejection port 8.

(Embodiment A2)

Figure 3:
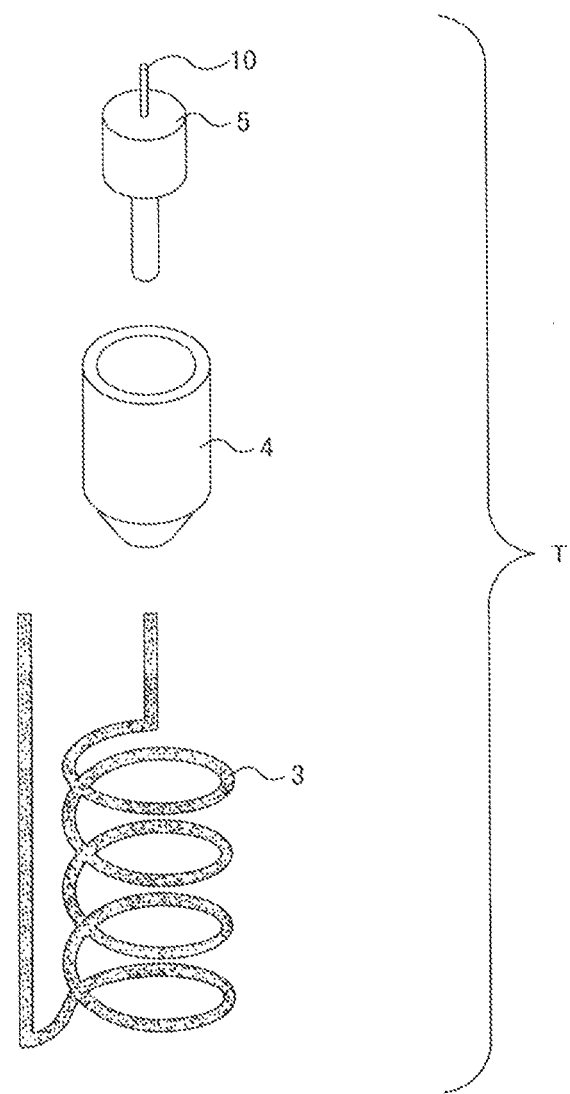
FIG. 3 is an exploded perspective view of a plasma processing apparatus according to the embodiment A2.

Hereinafter, an embodiment A2 will be described with reference to FIG. 3. FIG. 3 is an exploded perspective view of a plasma processing apparatus according to the embodiment A2. FIG. 3 is an assembled configuration view of an induction coupling-type plasma torch unit, which is an array of perspective views of (a part of) the respective components. As shown in FIG. 3, the outside dielectric block may be formed into a cylindrical shape, and have a taper portion having the diameter narrowing toward the plasma ejection port at the bottom end.

In FIG. 3, the solenoid coil 3 which is formed of a conductor into a cylindrical shape is disposed in the vicinity of a quartz block group formed by inserting the inside dielectric block 5 into the inside of the outside dielectric block 4. The plasma gas supply pipe 10 is provided in the inside dielectric block 5. Meanwhile, the cross-sectional view of the induction coupling-type plasma torch unit is the same as FIG. 1A. That is, since a round circular chamber is configured, round doughnut-shaped plasma P is generated along the shape. Therefore, since the high-frequency electric power exerting per unit volume increases due to the volume of the chamber becoming small compared to the examples of the related art, the plasma generation efficiency improves.

In addition, since the gap g of the path communicating the circular chamber and the plasma ejection port 8 which serves as an opening portion is configured to be as extremely narrow as 0.5 mm, the circular plasma P may not intrude into the path, and remains in the chamber (a region on the upstream side of the path). Therefore, extremely stable circular plasma P is maintained without occurrence of the fluctuation of the circular plasma P even when the gas flux increases. Therefore, compared to the examples of the related art, the embodiment A1 enables significantly stabilized generation of plasma.

Meanwhile, FIG. 3 does not show the cooling medium path, but it is also possible to employ the same configuration as in the embodiment A1. In addition, similarly to the cylindrical induction coupling-type plasma torch of the related art, it is also possible to employ a method in which the outside dielectric block 4 is made into a double tube structure, and a cooling medium is made to flow between the double tube structure.

(Embodiment A3)

Figure 4A:
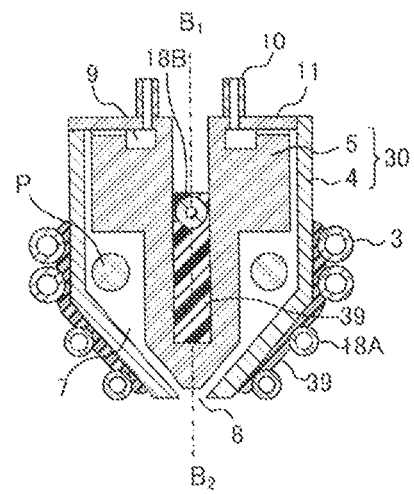
FIGS. 4A and 4B are cross-sectional views of a plasma processing apparatus according to an embodiment A3 respectively.
Figure 4B:
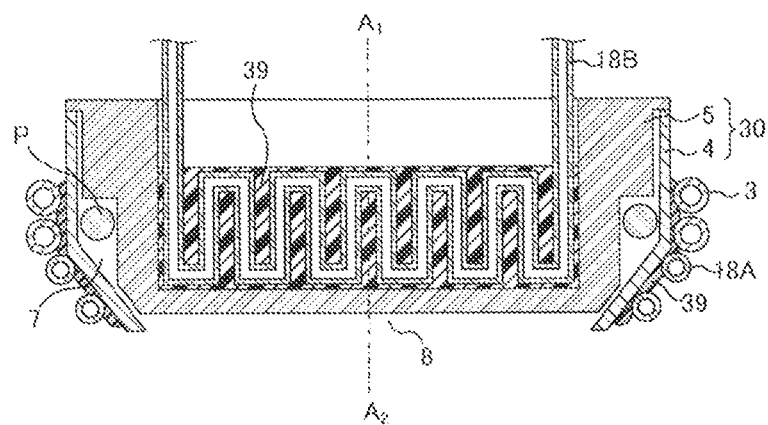

FIG. 4A is a cross-sectional view of a schematic plasma processing apparatus, that is, a unit T according to an embodiment A3 cut at a surface that is perpendicular to the base material 2. FIG. 4A shows a state of the plasma processing apparatus in use in which the base material 2 is disposed on the base material mounting table 1, and a plasma processing is performed on the thin film 22 on the surface of the base material 2. FIG. 4B is a cross-sectional view cut at a surface that is in parallel with the longitudinal direction of the unit T and is perpendicular to the base material along the dotted line $B_1$-$B_2$ in FIG. 4A. FIG. 4A is a cross-sectional view of the unit T cut along the dotted line $A_1$-$A_2$ in FIG. 4B.

In FIGS. 4A and 4B, the quartz tubes 18A and 18B that constitute the cooling medium paths in the inside are joined to the outside dielectric block 4 and the inside dielectric block 5 respectively using an adhesive 39. The quartz tube 18A is joined to the outer wall surface of the outside dielectric block 4. The quartz tube 18B is joined to the recess portion provided in the inside of the inside dielectric block 5 using the adhesive 39. In addition, the solenoid coil 3 is joined to the outer wall surface of the outside dielectric block 4, whereby both the solenoid coil 3 and the outside dielectric block 4 can be cooled.

In addition, the quartz tube 18B is bent in a waveform and accommodated in the recess portion of the inside dielectric block 5. Therefore, the entire recess portion can be cooled effectively by supplying and draining a cooling medium above the inside dielectric block 5. In addition, it is also possible to effectively cool the outer wall surface (the inner wall surface of the long chamber) of the inside dielectric block 5 which is in contact with the plasma P.

In addition, since the recess portion is formed above the inside dielectric block 5, the plasma gas manifolds 9 and the plasma gas supply pipes 10 are provided at two places in parallel with the longitudinal direction of the torch unit. The above configuration also has an advantage of being able to control the gas flux balance in the two gas supply systems (the plasma gas manifold 9 and the plasma gas supply pipe 10).

(Embodiment A4)

Figure 5:
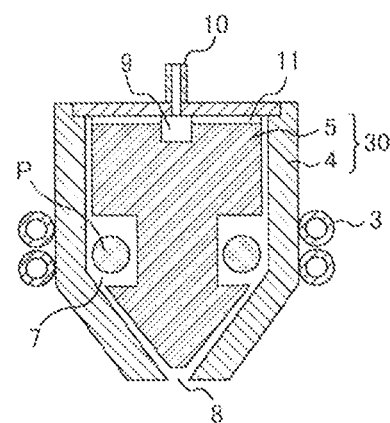
FIG. 5 is a cross-sectional view of a plasma processing apparatus according to an embodiment A4.

FIG. 5 is a cross-sectional view of a plasma processing apparatus according to an embodiment A4 which is cut at a surface that is perpendicular to the longitudinal direction of an induction coupling-type plasma torch unit, and corresponds to FIG. 1A. The embodiments A1 to A3 had a configuration in which the bottom part of the outside dielectric block 4 is contracted so as to guide the plasma flow to the narrow slit-shaped plasma ejection port 8. In addition, the inside dielectric block 5 configured two parallel plane portions that constituted the inner wall surface of a circular chamber and two inclined surface portions parallel to the inclined surface that constituted the contracting portion below the outside dielectric block 4 linked to the planar portion. That is, the inside 7 of the chamber 30 was configured to have the width that gradually narrows downward (the side near the plasma ejection port 8).

In the embodiment A4, a groove is formed on the inside of the central portion of the inside dielectric block 5 so as to configure a space in the inside 7 of the chamber 30 between the groove and the inner wall surface of the outside dielectric block 4. That is, the inside 7 of the long chamber 30 has a cross section that is close to a cuboid shape (the width of the chamber is almost constant in the vertical direction).

The above configuration further stabilizes the generation location of the circular plasma P.

Meanwhile, in the following embodiments including the embodiment A4, the cooling medium paths for cooling the component members of the unit T will not be described. The embodiments can appropriately have the same configuration as described in the embodiments 1 and 3 according to necessity.

(Embodiment A5)

Figure 6:
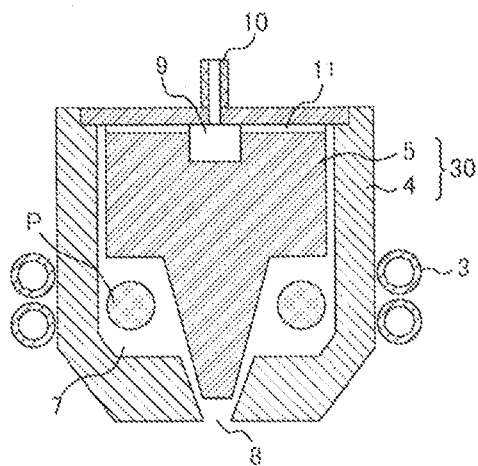
FIG. 6 is a cross-sectional view of a plasma processing apparatus according to an embodiment A5.

FIG. 6 is a cross-sectional view of a plasma processing apparatus according to an embodiment A5 which is cut at a surface that is perpendicular to the longitudinal direction of an induction coupling-type plasma torch unit, and corresponds to FIG. 1A. In the embodiment A5, an inner wall surface that forms the inner wall surface of the inside 7 of the long chamber 30 and is in parallel with the base material mounting table 1 below the outside dielectric block 4. In addition, the inside dielectric block 5 is configured to have a shape which becomes sharper downward so that the width of the block gradually narrows toward the plasma ejection port 8.

The above configuration can shorten the path for suppressing the intrusion of the circular plasma P so as to obtain plasma ejection with a larger intensity.

(Embodiment A6)

Figure 7:
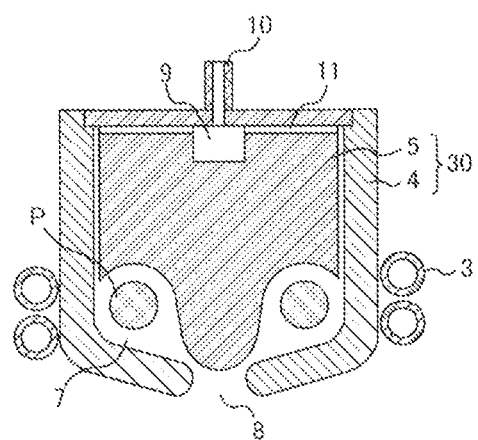
FIG. 7 is a cross-sectional view of a plasma processing apparatus according to an embodiment A6.

FIG. 7 is a cross-sectional view of a plasma processing apparatus according to an embodiment A6 which is cut at a surface that is perpendicular to the longitudinal direction of an induction coupling-type plasma torch unit. FIG. 7 corresponds to FIG. 1A. In the embodiment A6, the portions of the outside dielectric block 4 and the inside dielectric block 5 which form the inner wall surfaces of the inside 7 of the long chamber 30 are configured to be smooth curved surfaces.

The above configuration further stabilizes the generation location of the circular plasma P. In addition, it is possible to effectively suppress the concentration of deterioration of the respective quartz blocks at specific portions. As a result, the service life of products extends.

(Embodiment A7)

Figure 8:
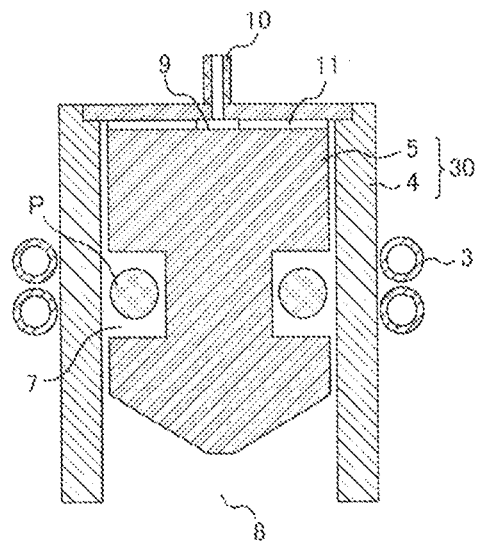
FIG. 8 is a cross-sectional view of a plasma processing apparatus according to an embodiment A7.

FIG. 8 is a cross-sectional view of a plasma processing apparatus according to an embodiment A7 which is cut at a surface that is perpendicular to the longitudinal direction of an induction coupling-type plasma torch unit. FIG. 8 corresponds to FIG. 1A. In the embodiment A7, the bottom part of the outside dielectric block 4 is configured so that the cross-sectional view cut at a surface in parallel with the base material mounting table 1 has the same shape. In addition, a groove is formed toward the inside of the inside dielectric block 5 at the central portion. A space is configured in the inside 7 of the chamber 30 between the groove and the inner wall surface of the outside dielectric block 4. That is, the inside 7 of the long chamber 30 has a cross section that is close to a cuboid shape (the width of the chamber is almost constant in the vertical direction).

The above configuration further stabilizes the generation location of the circular plasma P. In addition, since the width of the plasma ejection port 8 is configured to be wide, the configuration is advantageous in a case in which the base material needs to be treated at a higher temperature.

(Embodiment A8)

Figure 9:
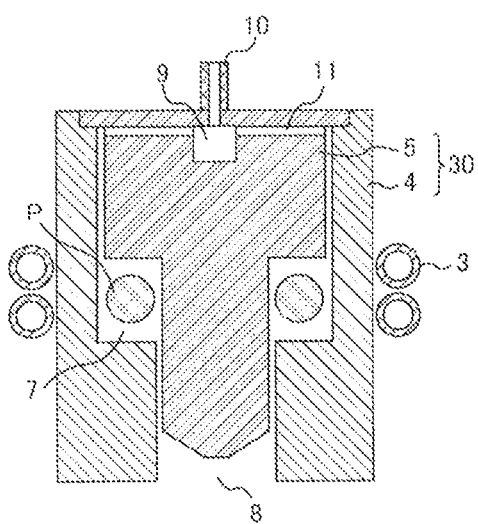
FIG. 9 is a cross-sectional view of a plasma processing apparatus according to an embodiment A8.

FIG. 9 is a cross-sectional view of a plasma processing apparatus according to an embodiment A8 which is cut at a surface that is perpendicular to the longitudinal direction of an induction coupling-type plasma torch unit. FIG. 9 corresponds to FIG. 1A. In the embodiment A8, the outside dielectric block 4 is configured to have an L-letter shaped cross section, and forms a space in the inside 7 of the chamber 30 with the inside dielectric block 5 configured to have a protrusion shape downward. That is, the inside 7 of the long chamber 30 has a cross section that is close to a cuboid shape (the width of the chamber is almost constant in the vertical direction).

The above configuration can further stabilize the generation location of the circular plasma P. In addition, since the width of the plasma ejection port 8 is configured to be relatively wide, the configuration is advantageous in a case in which the base material needs to be treated at a higher temperature.

(Embodiment A9)

Figure 10:
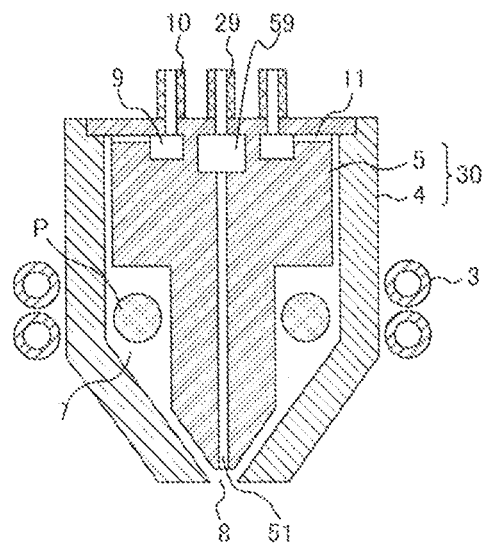
FIG. 10 is a cross-sectional view of a plasma processing apparatus according to an embodiment A9.

FIG. 10 is a cross-sectional view of a plasma processing apparatus according to an embodiment A9 which is cut at a surface that is perpendicular to the longitudinal direction of an induction coupling-type plasma torch unit. FIG. 10 corresponds to FIG. 1A. The embodiment A9 is configured to have the plasma gas manifolds 9, the plasma gas supply pipes 10, and the plasma gas supply holes 11 (penetrating holes) at two places in parallel with the longitudinal direction of the torch unit in the inside dielectric block 5 (a plurality of round plasma gas supply holes 11 is provided in the longitudinal direction).

The above configuration can control the gas flux balance in the two gas supply systems (the plasma gas manifold 9 and the plasma gas supply pipe 10).

Furthermore, an additional gas manifold 59, an additional gas supply pipe 29, and an additional gas supply hole 51 are provided in the inside dielectric block 5 so as to form a configuration in which the same kind or a different kind of gas from the plasma gas can be supplied toward the base material from the plasma ejection port 8.

The above configuration can supply a variety of gases such as etching gas, doping gas, and deposition gas as additional gases, and cause a variety of reactions on the surface of the base material. When such a reactive additional gas is directly supplied to the inside 7 of the chamber 30 having a high plasma density, the outside dielectric block 4 and the inside dielectric block 5 which constitute the long circular chamber are significantly modified. However, in the embodiment A9, it is possible to effectively accelerate the reactions on the surface of the base material while avoiding such modification.

(Embodiment A10)

Figure 11:
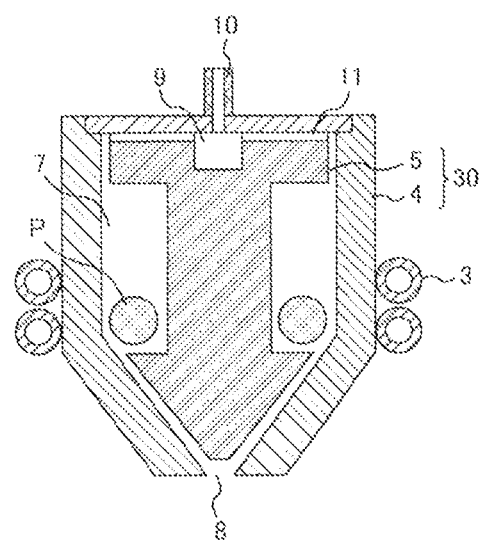
FIG. 11 is a cross-sectional view of a plasma processing apparatus according to an embodiment A10.

FIG. 11 is a cross-sectional view of a plasma processing apparatus according to an embodiment A10 which is cut at a surface that is perpendicular to the longitudinal direction of an induction coupling-type plasma torch unit. FIG. 11 corresponds to FIG. 1A. The embodiment A10 is the same as the embodiment A7 that a groove is formed toward the inside of the inside dielectric block 5 at the central portion, and a space is configured in the inside 7 of the chamber 30 between the groove and the inner wall surface of the outside dielectric block 4. However, the embodiment A10 is different from the embodiment A7 that the groove extends to above the solenoid coil 3. The above configuration further facilitates ignition of a discharge.

(Embodiment A11)

Figure 12:
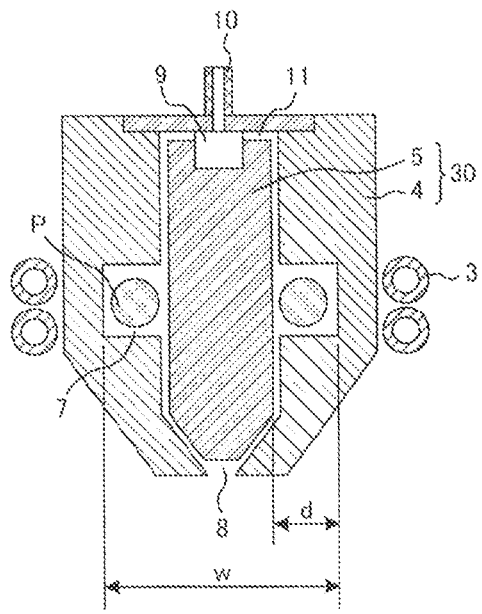
FIG. 12 is a cross-sectional view of a plasma processing apparatus according to an embodiment A11.

FIG. 12 is a cross-sectional view of a plasma processing apparatus according to an embodiment A11 which is cut at a surface that is perpendicular to the longitudinal direction of an induction coupling-type plasma torch unit. FIG. 12 corresponds to FIG. 1A. In the embodiment A11, the bottom part of the inside dielectric block 5 has a cross section cut at a surface in parallel with the base material mounting table 1 having the same shape. In addition, a groove is formed toward the outside of the outside dielectric block 4 at the central portion. A space is configured in the inside 7 of the chamber 30 between the groove and the outer wall surface of the inside dielectric block 5. That is, the inside 7 of the long chamber 30 has a cross section that is close to a cuboid shape (the width of the chamber is almost constant in the vertical direction).

The above configuration can shorten the plasma path (the gap of the path communicating the inside 7 of the long chamber and the plasma ejection port 8) reaching the plasma ejection port 8 from the inside 7 of the long chamber 30. As a result, it is possible to irradiate the base material with higher-temperature plasma.

The dimension of the gap of the path communicating the long circular chamber 30 and the plasma ejection port 8 which serves as the opening portion has been described in detail in the embodiment A1; however, herein, other dimensions will be described.

The size of the circular chamber (the size of a series of tied laces that constitute the circular chamber) is represented by d. That is, the gap between the inside side surface of the outside dielectric block 4 and the inside side surface of the inside dielectric block 5 in which the circular generation region of the plasma P is formed in the inside 7 of the chamber is represented by d. In FIG. 12, the distance between the inner wall surface of the groove provided in the outside dielectric block 4 and the outer wall surface of the inside dielectric block 5 is indicated by d. In addition, the outer diameter of the circular chamber (the size of the entire circular chamber) is indicated by w. In FIG. 12, the outer diameter of the mutually facing inner wall surface on the outside of the groove provided in the outside dielectric block 4 is indicated by w. Then, since the circular chamber is long, the outer diameter w of the circular chamber is different at the long side portion and the short side portion, and the outer diameter w of the circular chamber is shorter at the long side portion.

As a result of detailed experimental studies regarding the distances d (the size of the circular chamber) and w (the outer diameter of the circular chamber), it was found that, when d is less than 1 mm, it becomes extremely difficult to generate high-density thermal plasma in the circular chamber. In addition, in a case in which w is less than 10 mm, it was found that it becomes extremely difficult to generate high-density thermal plasma in the circular chamber. It was found from the above tests that the size of the circular chamber is preferably 1 mm or more, and the outer diameter of the circular chamber is preferably 10 mm or more.

In addition, since the plasma generation efficiency decreases when d is too large, the size d of the circular chamber is desirably 10 mm or less.

Therefore, it is preferable to satisfy at least one condition of (a) the size of the circular chamber is 1 mm to 10 mm and (b) the outer diameter of the circular chamber is 10 mm or more.

(Embodiment A12)

Figure 13:
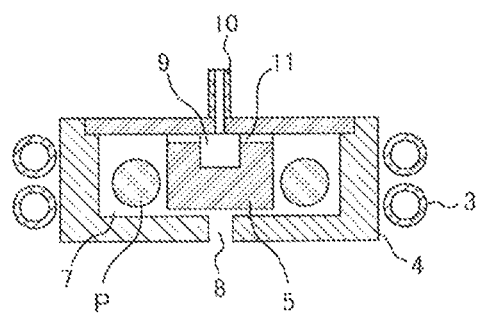
FIG. 13 is a cross-sectional view of a plasma processing apparatus according to an embodiment A12.

FIG. 13 is a cross-sectional view of a plasma processing apparatus according to an embodiment A12 which is cut at a surface that is perpendicular to the longitudinal direction of an induction coupling-type plasma torch unit. FIG. 13 corresponds to FIG. 1A. In the embodiment A12, the gap of the path communicating the inside 7 of the chamber and the plasma ejection port 8 is provided between the inner wall surface of the bottom portion of the outside dielectric block 4 and the outer wall surface of the bottom portion of the inside dielectric block 5. The gap of the path communicating the inside 7 of the chamber and the plasma ejection port 8 is configured to have an extremely short length.

The above configuration can irradiate the base material with high-temperature plasma. In addition, it is possible to decrease the torch unit to an extreme extent.

(Embodiment A13)

Figure 14:
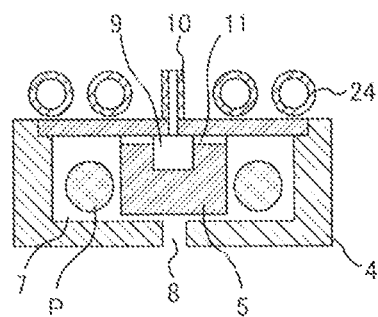
FIG. 14 is a cross-sectional view of a plasma processing apparatus according to an embodiment A13.

FIG. 14 is a cross-sectional view of a plasma processing apparatus according to an embodiment A13 which is cut at a surface that is perpendicular to the longitudinal direction of an induction coupling-type plasma torch unit. FIG. 14 corresponds to FIG. 1A. In the embodiment A13, similarly to the embodiment A12, the gap of the path communicating the inside 7 of the chamber 30 and the plasma ejection port 8 is provided between the inner wall surface of the bottom portion of the outside dielectric block 4 and the outer wall surface of the bottom portion of the inside dielectric block 5. In addition, the gap of the path communicating the inside 7 of the chamber 30 and the plasma ejection port 8 is configured to have an extremely short length. Furthermore, a planar spiral coil 24 is provided above the inside dielectric block 5 instead of the solenoid coil 3.

The above configuration can irradiate the base material with high-temperature plasma. In addition, it is possible to decrease the torch unit to an extreme extent.

(Embodiment A14)

Figure 15:
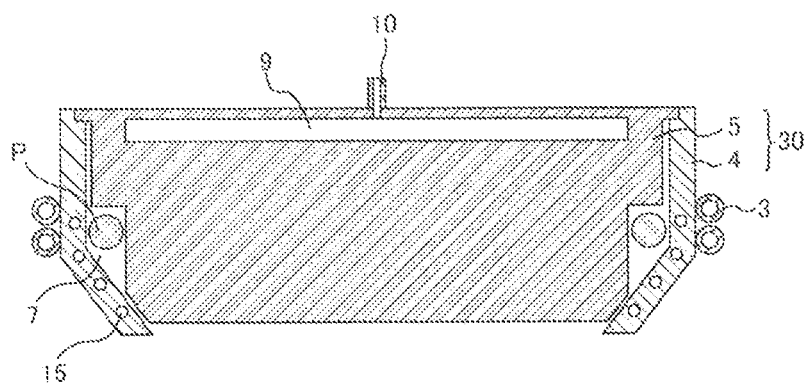
FIG. 15 is a cross-sectional view of a plasma processing apparatus according to an embodiment A14.
Figure 16:
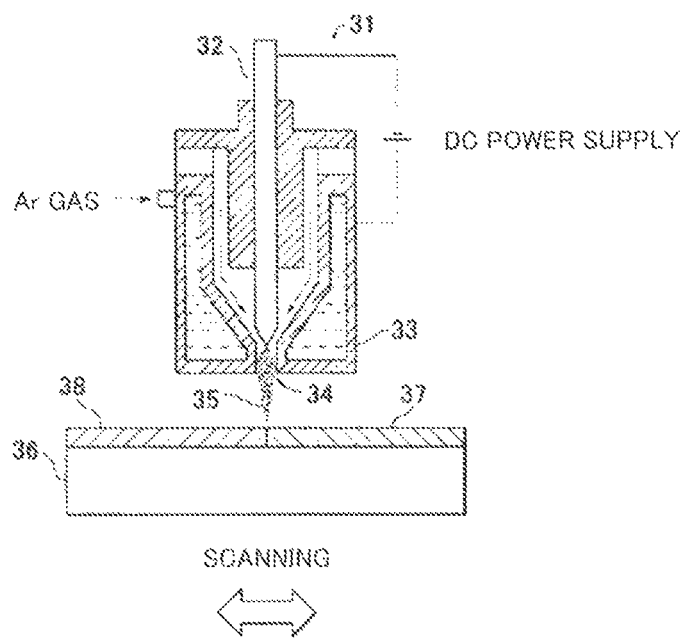
FIG. 16 is a cross-sectional view of a plasma processing apparatus according to an example of the related art.
Figure 17:
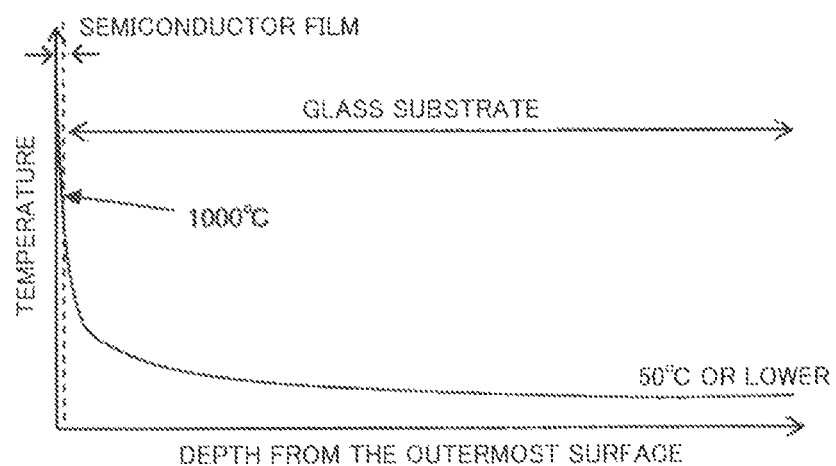
FIG. 17 is a conceptual view showing the relationship between the depth from the outermost surface and temperature in the example of the related art.

FIG. 15 is a cross-sectional view of a plasma processing apparatus according to an embodiment A14 which is cut at a surface that is parallel with the longitudinal direction of an induction coupling-type plasma torch unit and is perpendicular to the base material. FIG. 15 corresponds to FIG. 1B. In the embodiment A14, the path communicating the inside 7 of the chamber 30 and the plasma ejection port 8 is not provided at a portion corresponding to the short side portion of the long chamber 30. That is, a path communicating the chamber and the opening portion is provided in parallel with the longitudinal direction of the opening portion (not provided at portions that are not parallel with the longitudinal direction of the opening portion).

The above configuration can generate plasma more efficiently. In addition, a phenomenon in which a plasma flow ejected from both end portions of the plasma ejection port 8 becomes excessive can be suppressed using a simple configuration.

[Embodiment B]

(Embodiment B1)

Figure 18A:
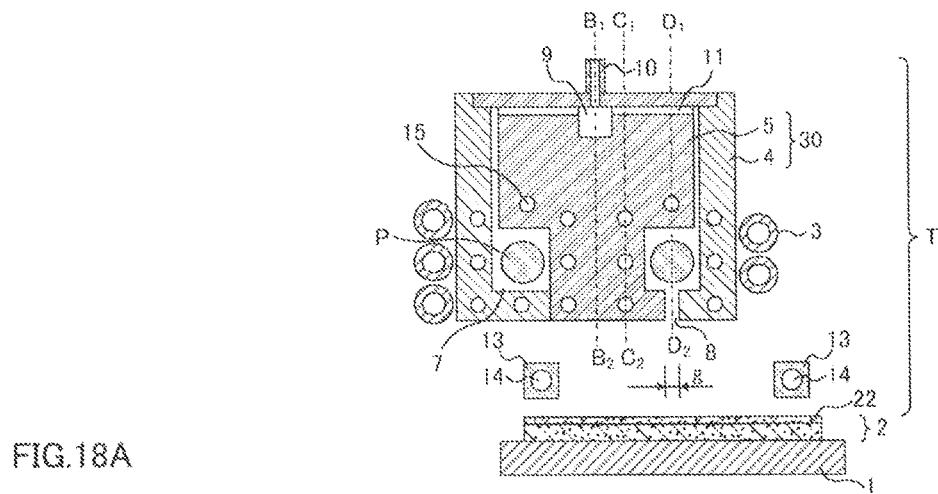
FIGS. 18A to 18D are $A_1$-$A_2$ cross-sectional view, $B_1$-$B_2$ cross-sectional view, $C_1$-$C_2$ cross-sectional view, and $D_1$-$D_2$ cross-sectional view of a plasma processing apparatus according to an embodiment B1 respectively.
Figure 18B:
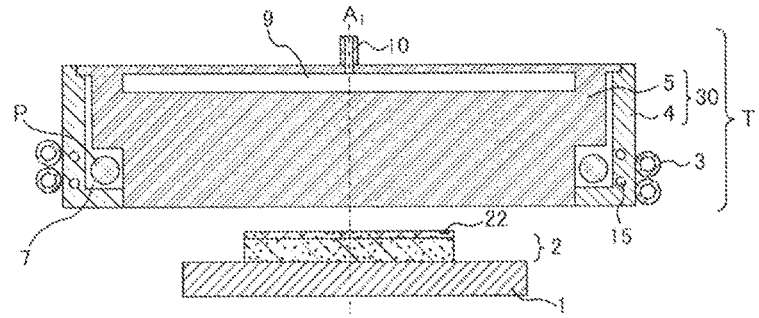
Figure 18C:
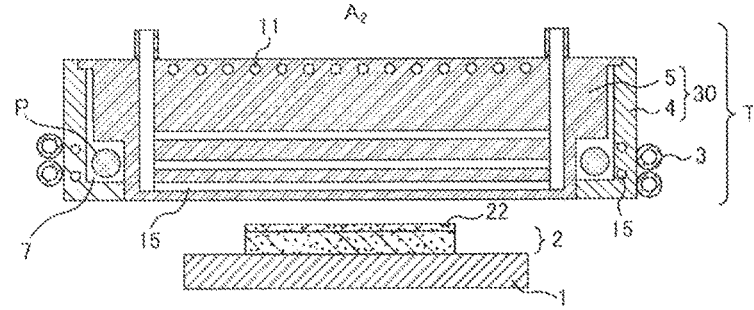
Figure 18D:
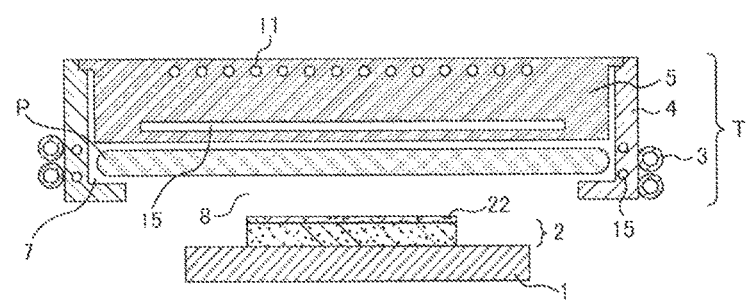

FIG. 18A is a cross-sectional view of an induction coupling-type plasma torch unit T of a plasma processing apparatus according to an embodiment B1 which is cut at a surface that is perpendicular to the base material 2. FIG. 18A shows a state of the plasma processing apparatus in use in which the base material 2 is disposed on the base material mounting table 1, and a plasma processing is performed on the thin film 22 on the surface of the base material 2. FIG. 18B is a cross-sectional view cut along the dotted line $B_1$-$B_2$ in FIG. 18A, FIG. 18C is a cross-sectional view cut along the dotted line $C_1$-$C_2$ in FIG. 18A, and FIG. 18D is a cross-sectional view cut along the dotted line $D_1$-$D_2$ in FIG. 18A.

As shown in FIG. 18B, in the plasma processing apparatus, the chamber has a long shape in the direction perpendicular to the direction of gravity. As shown in FIG. 18A, the outside dielectric block has a flange portion extending from the opening portion at the bottom end of the outside dielectric block. In the plasma processing apparatus, the bottom end of the protrusion body of the inside dielectric block extends to the opening portion of the outside dielectric block and forms the bottom portion of the chamber with the flange portion, and the plasma ejection port 8 is provided in a long line shape at one of the long sides of the chamber in a bottom surface view.

In FIGS. 18A to 18D, the base material 2 is mounted on the base material mounting table 1. In the induction coupling-type plasma torch unit T, the solenoid coil 3 made of a conductor is disposed in the vicinity of the outside dielectric block 4 and the inside dielectric block 5. The long chamber 30 made of a dielectric material is demarcated by a space surrounded by the outside dielectric block 4 and the inside dielectric block 5 (the inside 7 of the chamber 30). The inner wall surface of the chamber 30 near the solenoid coil 3 is a curved surface in parallel with the solenoid coil 3. Since the above configuration makes the distance from the solenoid coil 3 to the chamber 30 the same at an arbitrary portion of the solenoid coil 3, it becomes possible to generate induction coupling plasma using a small high-frequency power, and plasma can be efficiently generated.

The induction coupling-type plasma torch unit T is preferably surrounded by a wholly grounded shielding member (not shown) made of a conductor. This is because the leakage (noise) of high frequencies can be effectively prevented, and an abnormal discharge and the like which are not preferable can be effectively prevented.

The inside 7 of the chamber is surrounded by the inner wall surface of the outside dielectric block 4 which serves as the outside dielectric block and the outer wall surface of the inside dielectric block 5 which serves as the inside dielectric block into which the inside dielectric block is inserted. That is, the entire chamber is surrounded by a dielectric material. In addition, the inside 7 of the chamber is circular. Here, the circular shape refers to a shape forming a series of tied laces, and is not limited to a ring shape. The embodiment B exemplifies a racetrack-form (a shape of a series of tied laces in which straight portions constituted by two long sides and rings, ovals, or straight lines forming two short sides at both ends of the straight portions are coupled) long chamber. Plasma P generated in the inside 7 of the chamber is ejected toward the base material 2 from the plasma ejection port 8 which acts as a slit-shaped opening portion in the chamber 30. In addition, the longitudinal direction of the chamber and the longitudinal direction of the plasma ejection port 8 are disposed in parallel. In addition, the inside 7 of the chamber has a cross section that is close to a cuboid shape (the width of the chamber is almost constant in the vertical direction).

A plasma gas manifold 9 is provided in the inside of the inside dielectric block 5. Gas supplied to the plasma gas manifold 9 from the plasma gas supply pipe 10 is introduced into the inside 7 of the chamber through a plasma gas supply hole 11 (penetrating hole) which acts as a gas introduction portion provided in the inside dielectric block 5. The above configuration can easily realize a uniform gas flow in the longitudinal direction. The flux of gas introduced into the plasma gas supply pipe 10 is controlled using a flux control apparatus such as a mass flow controller provided upstream.

A plurality of the plasma gas supply holes 11 having a round hole shape is provided in the longitudinal direction, but the plasma gas supply hole may be a long slit.

In addition, a shielding gas nozzle 13 is disposed as a shielding gas supply opening at a portion near the base material mounting table 1, and a shielding gas manifold 14 is preferably provided in the shielding gas nozzle. As such, a two-path gas introduction system is provided. The above configuration supplies a shielding gas separately from plasma gas which is suitable for generation of plasma so that the incorporation of gas which is not necessary for or has an adverse influence on the treatment, such as oxygen and carbon dioxide in the atmosphere, into plasma-irradiating surfaces can be decreased. Meanwhile, the shielding gas supply opening may be a slit having a long shape in parallel with the longitudinal direction of the plasma ejection port 8. In addition, the shielding gas supply opening may be a plurality of holes arrayed in parallel with the longitudinal direction of the plasma ejection port 8.

The solenoid coil 3 is made of a hollow copper tube, and preferably forms a cooling medium path in the inside. This is because it becomes possible to cool the chamber by letting a cooling medium such as water flow. In addition, the cooling medium paths 15 are provided in the outside dielectric block 4 and the inside dielectric block 5 in parallel with the longitudinal direction of the plasma ejection port 8. In addition, the cooling medium paths 15 are provided in the outside dielectric block 4 perpendicularly with respect to the longitudinal direction of the plasma ejection port 8. The cooling medium paths 15 stereoscopically intersect with the cooling medium paths in parallel with the longitudinal direction of the plasma ejection port 8, and supply and drain a cooling medium from and to the outside. In addition, as shown in FIG. 18C, in the inside dielectric block 5, the cooling medium paths are converged and bundled, and a cooling medium is supplied from and drained to the outside. Since the cooling medium paths are round in the cross section, it is difficult for the component members to deform due to the internal pressure when a large amount of a cooling medium flows. That is, compared to the case of the technique described in Patent Document 6 in the examples of the related art in which cooling is performed in a double tube configuration, in the embodiment B, it is possible to let a far larger amount of a cooling medium flow, and to effectively cool the chamber.

The rectangular slit-shaped plasma ejection port 8 is communicated with only one of two long sides of the circular chamber. The base material mounting table 1 (or the base material 2 on the base material mounting table 1) is disposed opposite to the plasma ejection port 8. In this state, gas is supplied to the inside of the long chamber 30, and gas is ejected toward the base material 2 from the plasma ejection port 8. At the same time, a high-frequency power is supplied to the solenoid coil 3 from a high-frequency power supply (not shown) so as to generate the plasma P in the inside 7 of the chamber 30, and irradiate the base material 2 with the plasma from the plasma ejection port 8. Thereby, a plasma processing can be performed on a thin film 22 on the base material 2.

The base material 2 is preferably treated by relatively moving the chamber 30 and the base material mounting table 1 perpendicularly with respect to the longitudinal direction of the plasma ejection port 8. That is, the base material 2 is preferably treated by moving the induction coupling-type plasma torch unit T or the base material mounting table 1 in the horizontal direction in FIG. 18A and in the perpendicular direction to the paper surface of FIGS. 18B, 18C, and 18D.

In addition, in the embodiment B, the rectangular slit-shaped plasma ejection port 8 is configured to communicate with only one of two long sides of the circular chamber. The above configuration can significantly shorten the length of the path of a plasma flow communicating the inside 7 of the circular chamber and the plasma ejection port 8. Therefore, it is possible to irradiate the base material with higher-temperature plasma.

(Embodiment B2)

Figure 19:
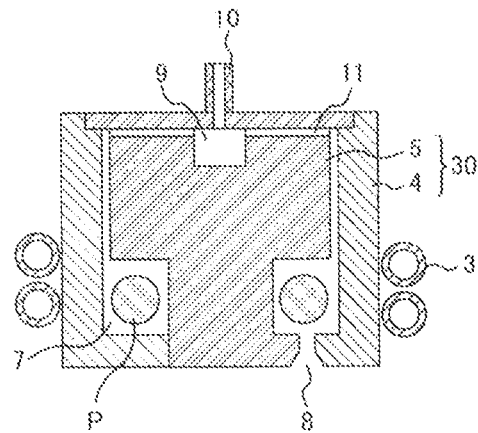
FIG. 19 is a perspective view of a plasma processing apparatus according to an embodiment B2.

FIG. 19 is a cross-sectional view of a plasma processing apparatus according to an embodiment B2 which is cut at a surface that is perpendicular to the longitudinal direction of an induction coupling-type plasma torch unit. FIG. 19 corresponds to FIG. 1A. In FIG. 19, the plasma ejection port 8 is configured to have the opening width increasing toward the base material mounting table 1. The above configuration can effectively suppress the fluctuation of the circular plasma P and radiate plasma in a wider range.

(Embodiment B3)

Figure 20:
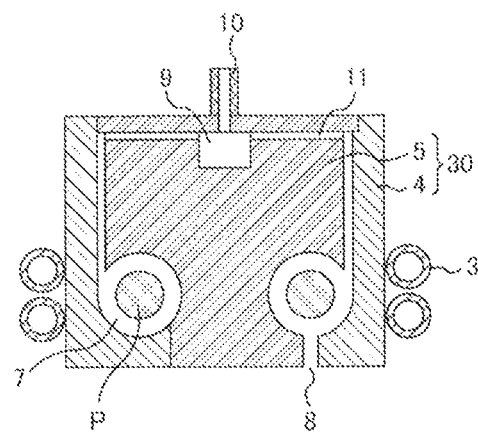
FIG. 20 is a perspective view of a plasma processing apparatus according to an embodiment B3.

FIG. 20 is a cross-sectional view of a plasma processing apparatus according to an embodiment B3 which is cut at a surface that is perpendicular to the longitudinal direction of an induction coupling-type plasma torch unit. FIG. 20 corresponds to FIG. 1A. In the embodiment B3, the portions of the outside dielectric block 4 and the inside dielectric block 5 which form the inner wall surfaces of the inside 7 of the chamber 30 are configured to be smooth curved surfaces.

The above configuration further stabilizes the generation location of the circular plasma P. In addition, the concentration of deterioration of the respective quartz blocks at specific portions can be effectively suppressed, and therefore the service life of products extends.

(Embodiment B4)

Figure 21:
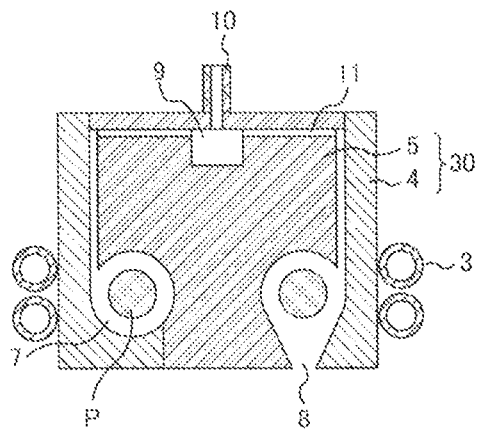
FIG. 21 is a perspective view of a plasma processing apparatus according to an embodiment B4.

FIG. 21 is a cross-sectional view of a plasma processing apparatus according to an embodiment B4 which is cut at a surface that is perpendicular to the longitudinal direction of an induction coupling-type plasma torch unit. FIG. 21 corresponds to FIG. 1A. In the embodiment B4, the portions of the outside dielectric block 4 and the inside dielectric block 5 which form the inner wall surfaces of the inside 7 of the chamber 30 are configured to be smooth curved surfaces. In addition, the plasma ejection port 8 is configured to have the opening width increasing toward the base material mounting table.

The above configuration can further stabilize the generation location of the circular plasma P. In addition, since the concentration of deterioration of the respective quartz blocks at specific portions can be effectively suppressed, the service life of products extends. In addition, it is possible to effectively suppress the fluctuation of the circular plasma P, and to radiate higher-temperature plasma.

(Embodiment B5)

Figure 22:
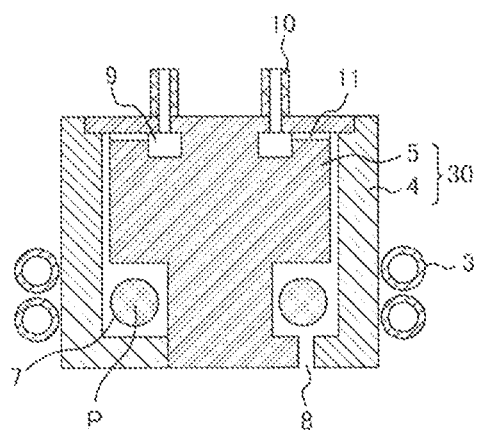
FIG. 22 is a perspective view of a plasma processing apparatus according to an embodiment B5.

FIG. 22 is a cross-sectional view of a plasma processing apparatus according to an embodiment B5 which is cut at a surface that is perpendicular to the longitudinal direction of an induction coupling-type plasma torch unit. FIG. 22 corresponds to FIG. 1A. The embodiment B5 is configured to have the plasma gas manifolds 9, the plasma gas supply pipes 10, and the plasma gas supply holes 11 (penetrating holes) at two places in parallel with the longitudinal direction of the torch unit in the inside dielectric block 5 (a plurality of round plasma gas supply holes 11 is provided in the longitudinal direction). The above configuration can control the gas flux balance in the two gas supply systems (the plasma gas manifold 9 and the plasma gas supply pipe 10).

(Embodiment B6)

Figure 23:
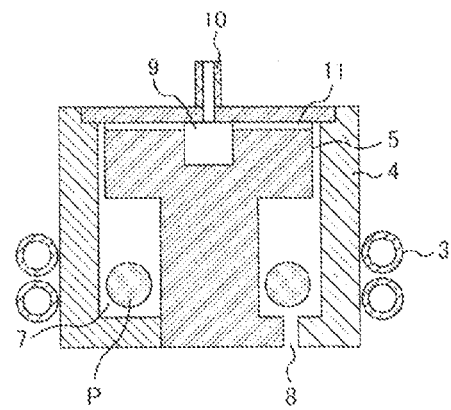
FIG. 23 is a perspective view of a plasma processing apparatus according to an embodiment B6.

FIG. 23 is a cross-sectional view of a plasma processing apparatus according to an embodiment B6 which is cut at a surface that is perpendicular to the longitudinal direction of an induction coupling-type plasma torch unit. FIG. 23 corresponds to FIG. 1A. The embodiment B6 is different that the long circular chamber extends forward more than the solenoid coil 3. The above configuration further facilitates ignition of a discharge.

(Embodiment B7)

Figure 24:
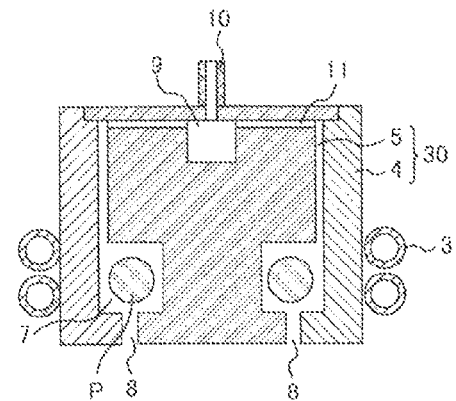
FIG. 24 is a perspective view of a plasma processing apparatus according to an embodiment B7.

FIG. 24 is a cross-sectional view of a plasma processing apparatus according to an embodiment B7 which is cut at a surface that is perpendicular to the longitudinal direction of an induction coupling-type plasma torch unit. FIG. 24 corresponds to FIG. 1A. As shown in FIG. 24, the plasma processing apparatus may further have a plasma ejection port formed into a long linear shape on the other long side in the bottom surface view of the chamber. As such, the embodiment B7 is configured to have two plasma ejection ports 8 which serve as the opening portion, and the respective plasma ejection ports communicate two long sides that constitute the space in the inside 7 of the circular chamber respectively. The above configuration can perform a faster treatment since the base material is irradiated with plasma twice when the torch unit is made to scan once.

(Embodiment B8)

Figure 25:
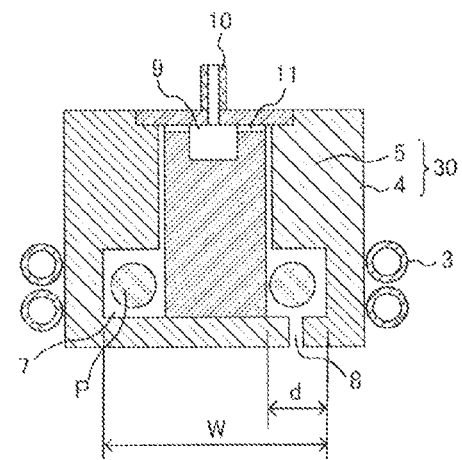
FIG. 25 is a perspective view of a plasma processing apparatus according to an embodiment B8.

FIG. 25 is a cross-sectional view of a plasma processing apparatus according to an embodiment B8 which is cut at a surface that is perpendicular to the longitudinal direction of an induction coupling-type plasma torch unit. FIG. 25 corresponds to FIG. 1A. In the embodiment B8, the bottom part of the inside dielectric block 5 has a cross section cut at a surface in parallel with the base material mounting table 1 having the same shape. In addition, a groove is formed toward the outside of the outside dielectric block 4 at the central portion so that a space is configured in the inside 7 of the chamber 30 between the groove and the outer wall surface of the inside dielectric block 5. The above configuration can realize a torch unit having a simpler structure.

The dimension of the gap of the path communicating the long circular chamber and the plasma ejection port 8 which serves as the opening portion has been described in detail in the embodiment B1. Herein, other dimensions will be described.

When "the size of the circular chamber (the size of a series of tied laces that constitute the circular chamber)" is represented by d, the gap between the inner wall surface of the groove provided in the outside dielectric block 4 and the outer wall surface of the inside dielectric block 5 indicated by d in FIG. 25. In addition, when the outer diameter (the size of the entire circular chamber) of the circular chamber is represented by w, the outer diameter of the mutually facing inner wall surface on the outside of the groove provided in the outside dielectric block 4 is indicated by w in FIG. 25. Since the circular chamber is long, the outer diameter w of the circular chamber is different at the long side portion and the short side portion, and the outer diameter w of the circular chamber is shorter at the long side portion.

As a result of detailed experimental studies regarding the distances d (the size of the circular chamber) and w (the outer diameter of the circular chamber), it was found that, when d is less than 1 mm, it becomes extremely difficult to generate high-density thermal plasma in the circular chamber. In addition, in a case in which w is less than 10 mm, it was found that it becomes extremely difficult to generate high-density thermal plasma in the circular chamber. It was found from the above tests that the size of the circular chamber is preferably 1 mm or more, and the outer diameter of the circular chamber is preferably 10 mm or more.

In addition, since the plasma generation efficiency decreases when d is too large, the size d of the circular chamber is desirably 10 mm or less.

(Embodiment B9)

Figure 26:
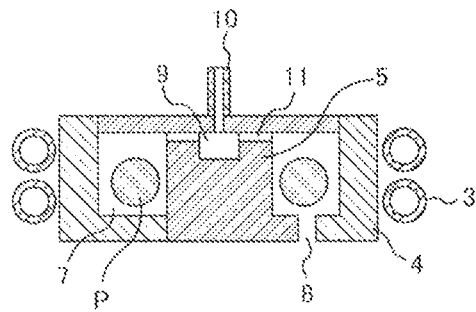
FIG. 26 is a perspective view of a plasma processing apparatus according to an embodiment B9.

FIG. 26 is a cross-sectional view of a plasma processing apparatus according to an embodiment B9 which is cut at a surface that is perpendicular to the longitudinal direction of an induction coupling-type plasma torch unit. FIG. 26 corresponds to FIG. 1A. In the embodiment B9, the height of the entire torch unit is decreased to a dimension slightly larger than the height of the solenoid coil 3. The above configuration can further minimize the plasma processing apparatus.

(Embodiment B10)

Figure 27:
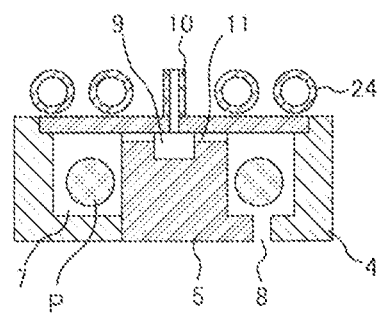
FIG. 27 is a perspective view of a plasma processing apparatus according to an embodiment B10.

FIG. 27 is a cross-sectional view of a plasma processing apparatus according to an embodiment B10 which is cut at a surface that is perpendicular to the longitudinal direction of an induction coupling-type plasma torch unit. FIG. 27 corresponds to FIG. 1A. In the embodiment B10, similarly to the embodiment B9, the height of the entire torch unit is decreased, and, furthermore, the planar spiral coil 24 is provided above the inside dielectric block 5 instead of the solenoid coil 3.

The above configuration can irradiate the base material with higher-temperature plasma, and can extremely minimize the torch unit.

[Embodiment C]
(Embodiment C1)

Figure 28A:
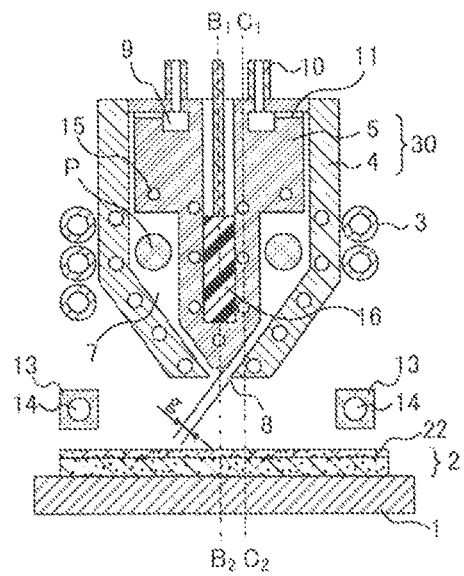
FIGS. 28A to 28C are $A_1$-$A_2$ cross-sectional view, $B_1$-$B_2$ cross-sectional view, and $C_1$-$C_2$ cross-sectional view of a plasma processing apparatus according to an embodiment C1 respectively.

FIG. 28A is a cross-sectional view cut at a surface perpendicular to the longitudinal direction of an induction coupling-type plasma torch unit in a plasma processing apparatus according to an embodiment C1.

Figure 28B:
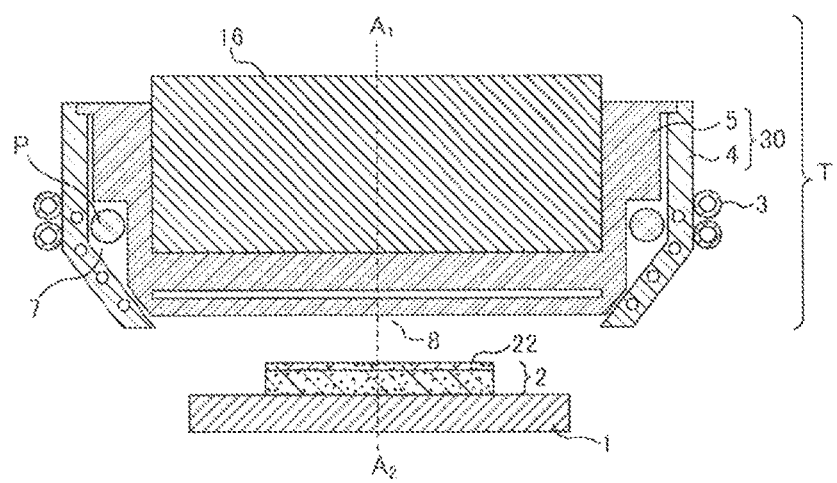
Figure 28C:
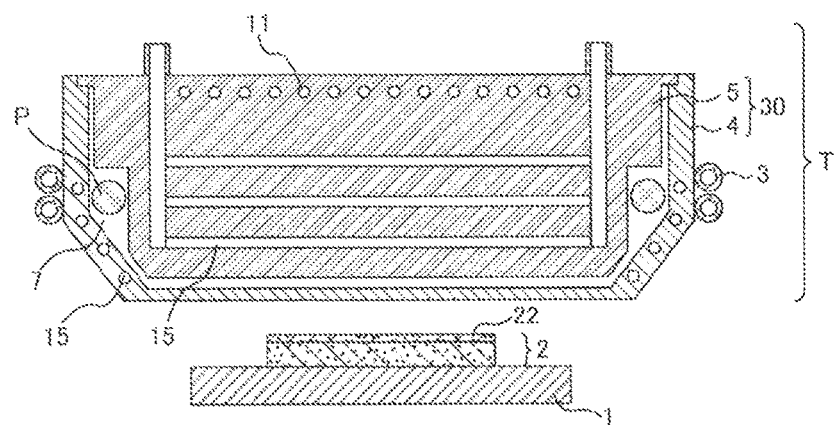
Figure 29:
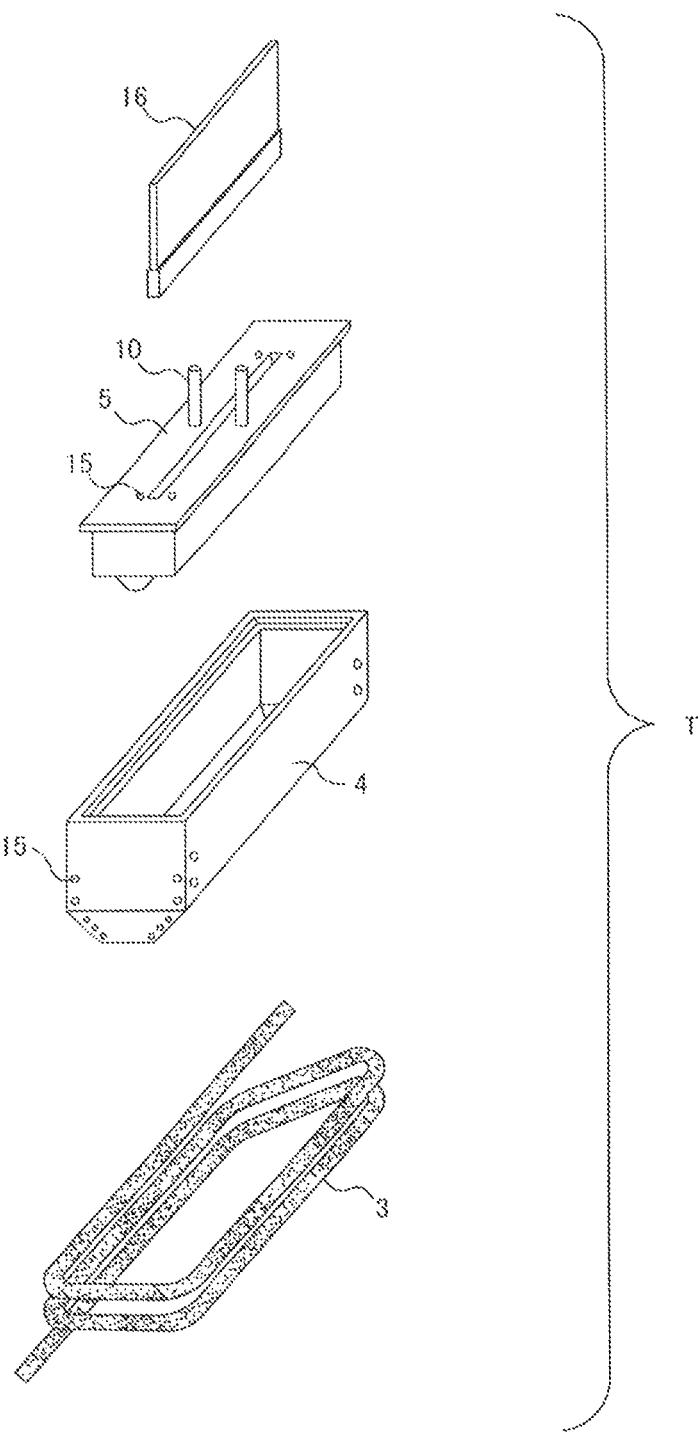
FIG. 29 is an exploded perspective view of a plasma processing apparatus according to the embodiment C1.

FIG. 28B is a cross-sectional view cut along the dotted line $B_1$-$B_2$ in FIG. 28A, and FIG. 28C is a cross-sectional view cut along the dotted line $C_1$-$C_2$ in FIG. 28A. FIG. 29 is an exploded perspective view of the plasma processing apparatus according to the embodiment C1.

The inside dielectric block is the plasma processing apparatus according to claim 1 having a conductor member in the inside. The conductor member is preferably grounded.

In FIGS. 28A and 28B, the base material 2 is mounted on the base material mounting table 1. In the induction coupling-type plasma torch unit T, the solenoid coil 3 made of a conductor is disposed in the vicinity of the outside dielectric block 4 and the inside dielectric block 5. The long chamber 30 made of a dielectric material is demarcated by a space surrounded by the outside dielectric block 4 and the inside dielectric block 5 (the inside 7 of the chamber 30). The inner wall surface of the chamber 30 near the solenoid coil 3 is a curved surface in parallel with the solenoid coil 3.

The above configuration makes the distance from the solenoid coil 3 to the chamber 30 the same at an arbitrary portion of the solenoid coil 3. As a result, it is possible to efficiently generate plasma using a small high-frequency power.

The induction coupling-type plasma torch unit T is preferably surrounded by a wholly grounded shielding member (not shown) made of a conductor. This is because the leakage (noise) of high frequencies can be effectively prevented, and an abnormal discharge and the like which are not preferable can be effectively prevented.

The inside 7 of the long chamber is surrounded by the inner wall surface of the inside dielectric block 5 which serves as the inside dielectric block and the inner wall surface of the outside dielectric block 4 which serves as the outside dielectric block into which the inside dielectric block is inserted. That is, the entire chamber is surrounded by a dielectric material. In addition, the inside 7 of the chamber is circular.

Here, the "circular shape" refers to a shape forming a series of tied laces, and is not limited to a ring shape. The embodiment C1 exemplifies a racetrack-form (a shape of a series of tied laces in which straight portions constituted by two long sides and rings, ovals, or straight lines forming two short sides at both ends of the straight portions are coupled) long chamber 30. Plasma P generated in the inside 7 of the chamber 30 is ejected toward the base material 2 from the plasma ejection port 8 which acts as a slit-shaped opening portion in the chamber. In addition, the longitudinal direction of the chamber and the longitudinal direction of the plasma ejection port 8 are disposed in parallel.

A plasma gas manifold 9 is provided in the inside of the inside dielectric block 5. Gas supplied to the plasma gas manifold 9 from the plasma gas supply pipe 10 is introduced into the inside 7 of the chamber through a plasma gas supply hole 11 (penetrating hole) which acts as a gas introduction portion provided in the inside dielectric block 5. The above configuration can easily realize a uniform gas flow in the longitudinal direction. The flux of gas introduced into the plasma gas supply pipe 10 is controlled using a flux control apparatus such as a mass flow controller provided upstream.

A plurality of the plasma gas supply holes 11 having a round hole shape is provided in the longitudinal direction, but the plasma gas supply hole may be a long slit.

In addition, a shielding gas nozzle 13 is disposed as a shielding gas supply opening at a portion near the base material mounting table 1, and a shielding gas manifold 14 is provided in the shielding gas nozzle. As such, a two-path gas introduction system is preferably provided. The above configuration supplies a shielding gas separately from plasma gas which is suitable for generation of plasma so that the incorporation of gas which is not necessary for or has an adverse influence on the treatment, such as oxygen and carbon dioxide in the atmosphere, into plasma-irradiating surfaces can be decreased.

Meanwhile, the shielding gas supply opening may be a slit having a long shape in parallel with the longitudinal direction of the plasma ejection port 8. In addition, the shielding gas supply opening may be a plurality of holes arrayed in parallel with the longitudinal direction of the plasma ejection port 8.

The solenoid coil 3 is made of a hollow copper tube, and preferably forms a cooling medium path in the inside. That is, it is possible to cool the chamber by letting a cooling medium such as water flow. In addition, the cooling medium paths 15 are provided in the outside dielectric block 4 and the inside dielectric block 5 in parallel with the longitudinal direction of the plasma ejection port 8. In addition, the cooling medium paths 15 are provided in the outside dielectric block 4 perpendicularly with respect to the longitudinal direction of the plasma ejection port 8, stereoscopically intersect with the cooling medium paths 15 that are in parallel with the longitudinal direction of the plasma ejection port 8, and supply and drain a cooling medium from and to the outside.

In addition, as shown in FIG. 28C, in the inside dielectric block 5, the cooling medium paths are converged and bundled, and a cooling medium is supplied from and drained to the outside. Since the cooling medium paths are round in the cross section, it is difficult for the component members to deform due to the internal pressure when a large amount of a cooling medium flows. That is, compared to the case of the technique described in Patent Document 6 in the examples of the related art in which cooling is performed in a double tube configuration, in the embodiment C, it is possible to let a far larger amount of a cooling medium flow, and to effectively cool the chamber.

The rectangular slit-shaped plasma ejection port 8 is provided, and the base material mounting table 1 (or the base material 2 on the base material mounting table 1) is disposed opposite to the plasma ejection port 8. In this state, gas is supplied to the inside 7 of the long chamber 30. At the same time, a high-frequency power is supplied to the solenoid coil 3 from a high-frequency power supply (not shown) while gas is ejected toward the base material 2 from the plasma ejection port 8. Thereby, the plasma P is generated in the inside 7 of the chamber 30, and the base material 2 is irradiated with the plasma from the plasma ejection port 8 so that a plasma processing can be performed on a thin film 22 on the base material 2.

The base material 2 is preferably treated by relatively moving the long chamber and the base material mounting table 1 perpendicularly with respect to the longitudinal direction of the plasma ejection port 8. That is, the induction coupling-type plasma torch unit T or the base material mounting table 1 is preferably moved in the horizontal direction in FIG. 28A and in the perpendicular direction to the paper surface of FIGS. 28B and 28C. This is because it is possible to perform a treatment of a large-scale substrate or the like within a short period of time without increasing the size of the plasma processing apparatus.

Meanwhile, in the above configuration, since the length of the plasma ejection port 8 in the longitudinal direction is equal to or larger than the width of the base material 2, it is possible to treat the entire thin film 22 in the vicinity of the surface of the base material 2 with a single round of scanning (relative movement of the induction coupling-type plasma torch unit T and the base material mounting table 1). In addition, a grounding copper plate 16 which serves as the conductor member is inserted into the recess portion provided in the inside dielectric block 5 which serves as the inside dielectric block. When a high-frequency power is applied to the solenoid coil 3, a high electric field is generated between the solenoid coil 3 and the grounding copper plate 16, but the inside 7 of the chamber 30 locates between the solenoid coil and the grounding copper plate as a discharge space, and therefore it is possible to ignite plasma using an extremely low power (low voltage) compared to the related art. In the embodiment, the grounding copper plate 16 is grounded, but it is possible to ignite plasma more reliably using a grounding potential rather than a floating potential.

As shown in FIG. 29, when the inside dielectric block 5 is disposed in the inside of the outside dielectric block 4, the generation region of the plasma P is formed into a circular shape as shown in FIG. 28A between the inside side surface of the outside dielectric block 4 and the side surface of the inside dielectric block 5.

(Embodiment C2)

Figure 30:
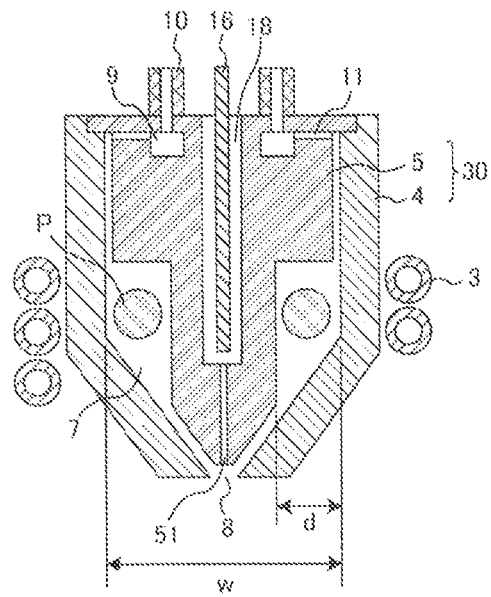
FIG. 30 is a cross-sectional view of a plasma processing apparatus according to an embodiment C2.

FIG. 30 is a cross-sectional view of a plasma processing apparatus according to an embodiment C2 which is cut at a surface that is perpendicular to the longitudinal direction of an induction coupling-type plasma torch unit. FIG. 30 corresponds to FIG. 1A. The embodiment C2 is configured to have the plasma gas manifolds 9, the plasma gas supply pipes 10, and the plasma gas supply holes 11 (penetrating holes) at two places in parallel with the longitudinal direction of the torch unit in the inside dielectric block 5. A plurality of round plasma gas supply holes 11 is provided in the longitudinal direction. The above configuration can control the gas flux balance in the two gas supply systems (the plasma gas manifold 9 and the plasma gas supply pipe 10).

Furthermore, an additional gas supply hole 51 is provided in the inside dielectric block 5 so as to form a configuration in which the same kind or a different kind of gas from the plasma gas can be supplied toward the base material from the plasma ejection port 8. The above configuration can supply a variety of gases such as etching gas, doping gas, and deposition gas as additional gases. Therefore, a variety of reactions can be caused on the surface of the base material. When such a reactive additional gas is directly supplied to the inside 7 of the chamber having a high plasma density, the outside dielectric block 4 and the inside dielectric block 5 which constitute the long circular chamber are significantly modified. However, in the embodiment C2, it is possible to effectively accelerate the reactions on the surface of the base material while avoiding such modification.

The dimension of the gap of the path communicating the long circular chamber and the plasma ejection port 8 which serves as the opening portion has been described in detail in the embodiment C1. Herein, other dimensions will be described.

"The size of the circular chamber (the size of a series of tied laces that constitute the circular chamber)" is represented by d. In FIG. 30, the gap between the inner wall surface of the groove provided in the outside dielectric block 4 and the outer wall surface of the inside dielectric block 5 indicated by d. In addition, the outer diameter (the size of the entire circular chamber) of the circular chamber is represented by w. In FIG. 30, the outer diameter of the mutually facing inner wall surface on the outside of the groove provided in the outside dielectric block 4 is indicated by w. Then, the circular chamber is long, and therefore the outer diameter w of the circular chamber is different at the long side portion and the short side portion, and the outer diameter w of the circular chamber is shorter at the long side portion.

As a result of detailed experimental studies regarding the distances d (the size of the circular chamber) and w (the outer diameter of the circular chamber), it was found that, when d is less than 1 mm, it becomes extremely difficult to generate high-density thermal plasma in the circular chamber. In addition, in a case in which w is less than 10 mm, it was found that it becomes extremely difficult to generate high-density thermal plasma in the circular chamber. It was found from the above tests that the size of the circular chamber is preferably 1 mm or more, and the outer diameter of the circular chamber is preferably 10 mm or more.

In addition, since the plasma generation efficiency decreases when d is too large, the size d of the circular chamber is desirably 10 mm or less.

(Embodiment C3)

Figure 31:
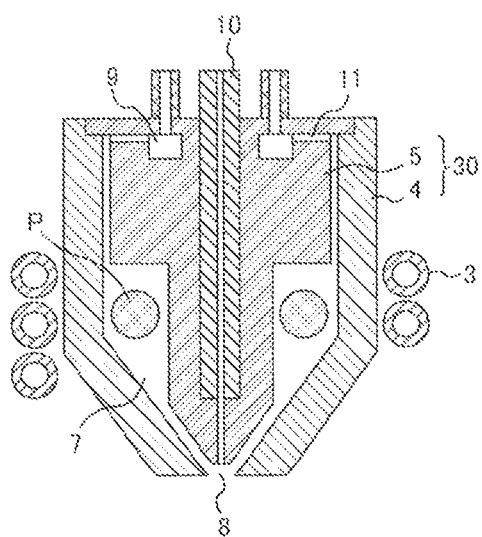
FIG. 31 is a cross-sectional view of a plasma processing apparatus according to an embodiment C3.

FIG. 31 is a cross-sectional view of a plasma processing apparatus according to an embodiment C3 which is cut at a surface that is perpendicular to the longitudinal direction of an induction coupling-type plasma torch unit. FIG. 31 corresponds to FIG. 1A. In the embodiment C3, an additional gas introduced into the additional gas supply hole 51 is introduced from the penetrating hole provided in the grounding copper plate 16. The above configuration can decrease an electric field applied to the additional gas compared to the embodiment C2, and therefore an abnormal discharge which is not preferable can be effectively suppressed.

(Embodiment C4)

Figure 32A:
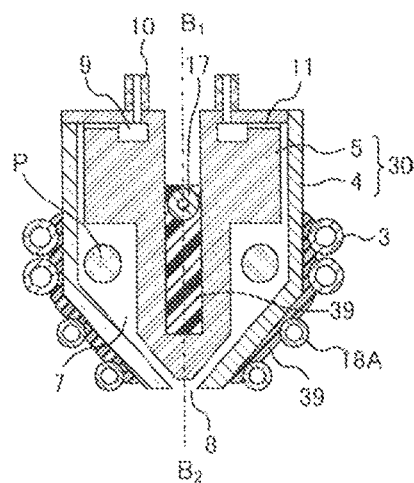
FIGS. 32A and 32B are $A_1$-$A_2$ cross-sectional view and $B_1$-$B_2$ cross-sectional view of a plasma processing apparatus according to an embodiment C4 respectively.
Figure 32B:
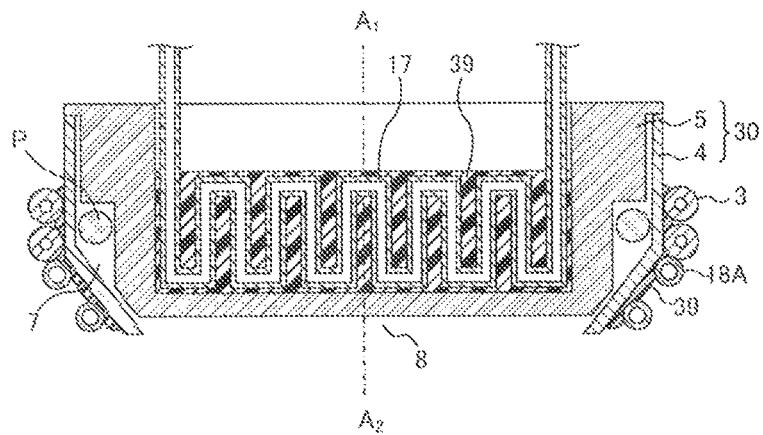

FIG. 32A is a cross-sectional view of a plasma processing apparatus according to an embodiment C4 which is cut at a surface that is perpendicular to the longitudinal direction of an induction coupling-type plasma torch unit. FIG. 32B is a cross-sectional view which is cut at a surface that is in parallel with the longitudinal direction of the induction coupling-type plasma torch unit, and is perpendicular to the base material. FIG. 32A is a cross-sectional view cut along the dotted line $A_1$-$A_2$ in FIG. 32B, and FIG. 32B is a cross-sectional view cut along the dotted line $B_1$-$B_2$ in FIG. 32A.

In FIG. 32A, the quartz tube 18A that constitutes the cooling medium paths in the inside is joined to the outside dielectric block 4 using the adhesive 39. In addition, the solenoid coil 3 is joined to the outer wall surface of the outside dielectric block 4 so as to form a configuration in which both the solenoid coil 3 and the outside dielectric block 4 can be cooled. In addition, a copper tube 17 formed into a waveform by bending the copper tube 17 is accommodated in the recess portion of the inside dielectric block 5, and is joined to the inside dielectric block 5 using the adhesive 39. The entire recess portion can be cooled effectively by supplying and draining a cooling medium with respect to the copper tube 17 above the inside dielectric block 5, and it is possible to effectively cool the outer wall surface (the inner wall surface of the chamber 30) of the inside dielectric block 5 which is in contact with the plasma P.

In addition, since the recess portion is formed above the inside dielectric block 5, the plasma gas manifolds 9 and the plasma gas supply pipes 10 are provided at two places in parallel with the longitudinal direction of the torch unit. The above configuration can control the gas flux balance in the two gas supply systems (the plasma gas manifold 9 and the plasma gas supply pipe 10).

(Embodiment C5)

Figure 33:
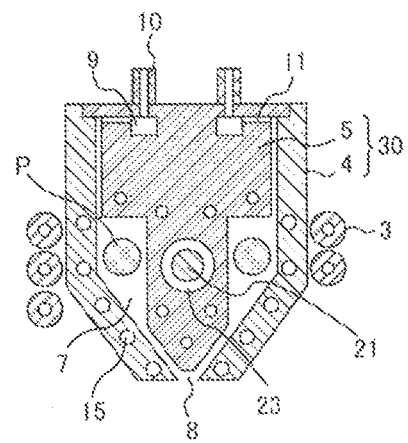
FIG. 33 is a cross-sectional view of a plasma processing apparatus according to an embodiment C5.

FIG. 33 is a cross-sectional view of a plasma processing apparatus according to an embodiment C5 which is cut at a surface that is perpendicular to the longitudinal direction of an induction coupling-type plasma torch unit. FIG. 33 corresponds to FIG. 1A. In the embodiment C5, a relatively large cooling medium path 21 is provided in parallel with the longitudinal direction of the torch unit in the inside dielectric block 5, and accommodates a copper rod 23 grounded in the inside. The cooling medium path 21 is provided between two long sides of the circular chamber. The above configuration can effective cool the grounded copper rod and the surface of the inside dielectric block 5 which is in contact with the chamber 30.

(Embodiment C6)

Figure 34:
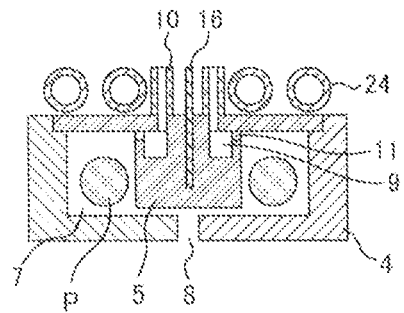
FIG. 34 is a cross-sectional view of a plasma processing apparatus according to an embodiment C6.

FIG. 34 is a cross-sectional view of a plasma processing apparatus according to an embodiment C6 which is cut at a surface that is perpendicular to the longitudinal direction of an induction coupling-type plasma torch unit. FIG. 34 corresponds to FIG. 1A. In the embodiment C6, the gap of the path communicating the inside 7 of the long chamber and the plasma ejection port 8 is provided between the inner wall surface of the bottom portion of the outside dielectric block 4 and the outer wall surface of the bottom portion of the inside dielectric block 5. In addition, the gap of the path communicating the inside 7 of the chamber and the plasma ejection port 8 is configured to have an extremely short length. Furthermore, the planar spiral coil 24 is provided above the inside dielectric block 5 instead of the solenoid coil 3. The above configuration can irradiate the base material with high-temperature plasma, and can decrease the torch unit to an extreme extent.

(Embodiment C7)

Figure 35:
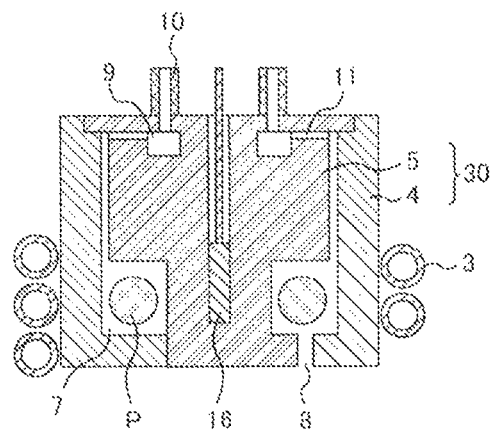
FIG. 35 is a cross-sectional view of a plasma processing apparatus according to an embodiment C7.

FIG. 35 is a cross-sectional view of a plasma processing apparatus according to an embodiment C7 which is cut at a surface that is perpendicular to the longitudinal direction of an induction coupling-type plasma torch unit. FIG. 35 corresponds to FIG. 1A. In the embodiment C7, the rectangular slit-shaped plasma ejection port 8 is configured to communicate with only one of two long sides of the circular chamber. The above configuration can extremely shorten the length of the path of a plasma flow communicating the inside 7 of the circular chamber and the plasma ejection port 8. As a result, it is possible to irradiate the base material with higher-temperature plasma.

The plasma processing apparatuses and methods described above simply exemplify typical examples in the applicable range of the invention.

For example, a round circular chamber may be configured using a solenoid coil made of a conductor which is formed into a cylindrical shape, the cylindrical first quartz block, and the cylindrical second quartz block. In this case, round doughnut-shaped plasma P is generated. The above configuration can realize a plasma processing that is excellent in terms of ignition properties compared to the examples of the related art.

In addition, the induction coupling-type plasma torch unit T may be scanned against the fixed base material mounting table 1, but the base material mounting table 1 may also be scanned against the fixed induction coupling-type plasma torch unit T.

In addition, using a variety of the configurations of the invention, it becomes possible to treat the vicinity of the surface of the base material 2 at a high temperature. Therefore, the invention can be applied to the crystallization of a TFT semiconductor film or the modification of a solar cell semiconductor film which has been described in detail in the examples of the related art. Additionally, the invention can be applied to a variety of surface treatments such as the cleaning or degassing reduction of a protective layer in a plasma display panel, the surface flattening or degassing reduction of a dielectric layer constituted by a collection of silica fine particles, the reflow of a variety of electric devices, and plasma doping using a solid impurity source.

In addition, as a method of manufacturing a solar cell, the invention can also be applied to a method in which powder obtained by crushing a silicon ingot is coated on a base material, and melted by irradiating plasma, thereby obtaining a polycrystalline silicon film.

[Embodiment D]

(Embodiment D1)

Figure 36A:
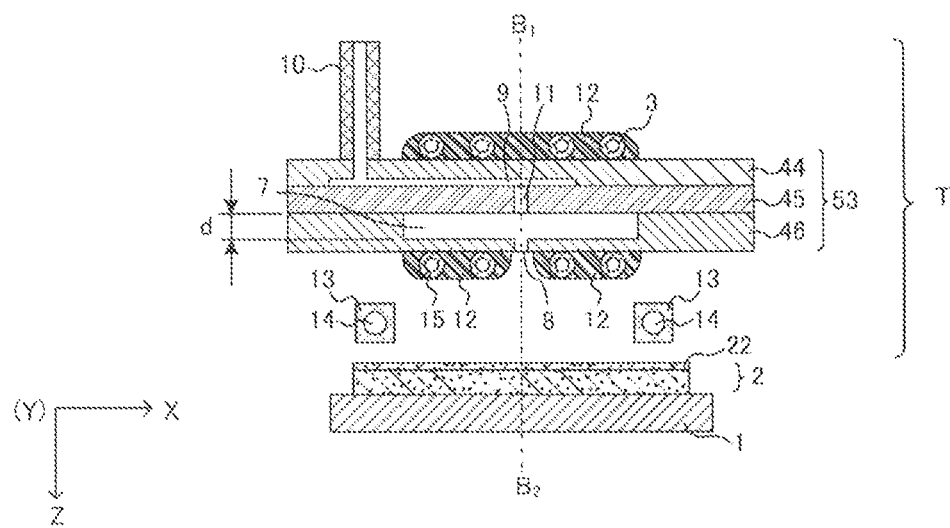
FIGS. 36A and 36B are $A_1$-$A_2$ cross-sectional view and $B_1$-$B_2$ cross-sectional view of a plasma processing apparatus according to an embodiment D1 respectively.
Figure 36B:
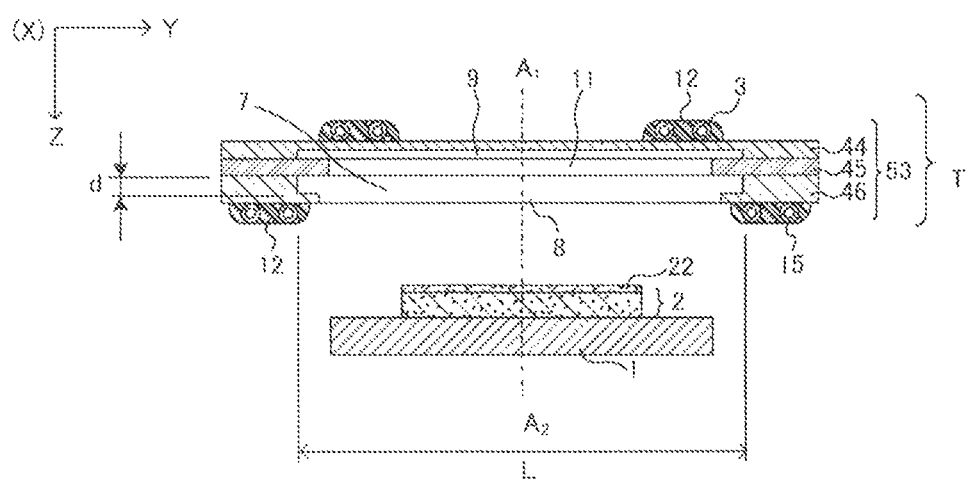

FIG. 36A is a cross-sectional view of a plasma processing apparatus according to an embodiment D1 which is cut at a surface that is perpendicular to the longitudinal direction of the induction coupling-type plasma torch unit. FIG. 36B is a cross-sectional view which is cut at a surface that is in parallel with the longitudinal direction of the induction coupling-type plasma torch unit, and is perpendicular to the base material. FIG. 36B is a cross-sectional view cut along the dotted line $B_1$-$B_2$ in FIG. 36A, and FIG. 36A is a cross-sectional view cut along the dotted line $A_1$-$A_2$ in FIG. 36B.

Figure 37:
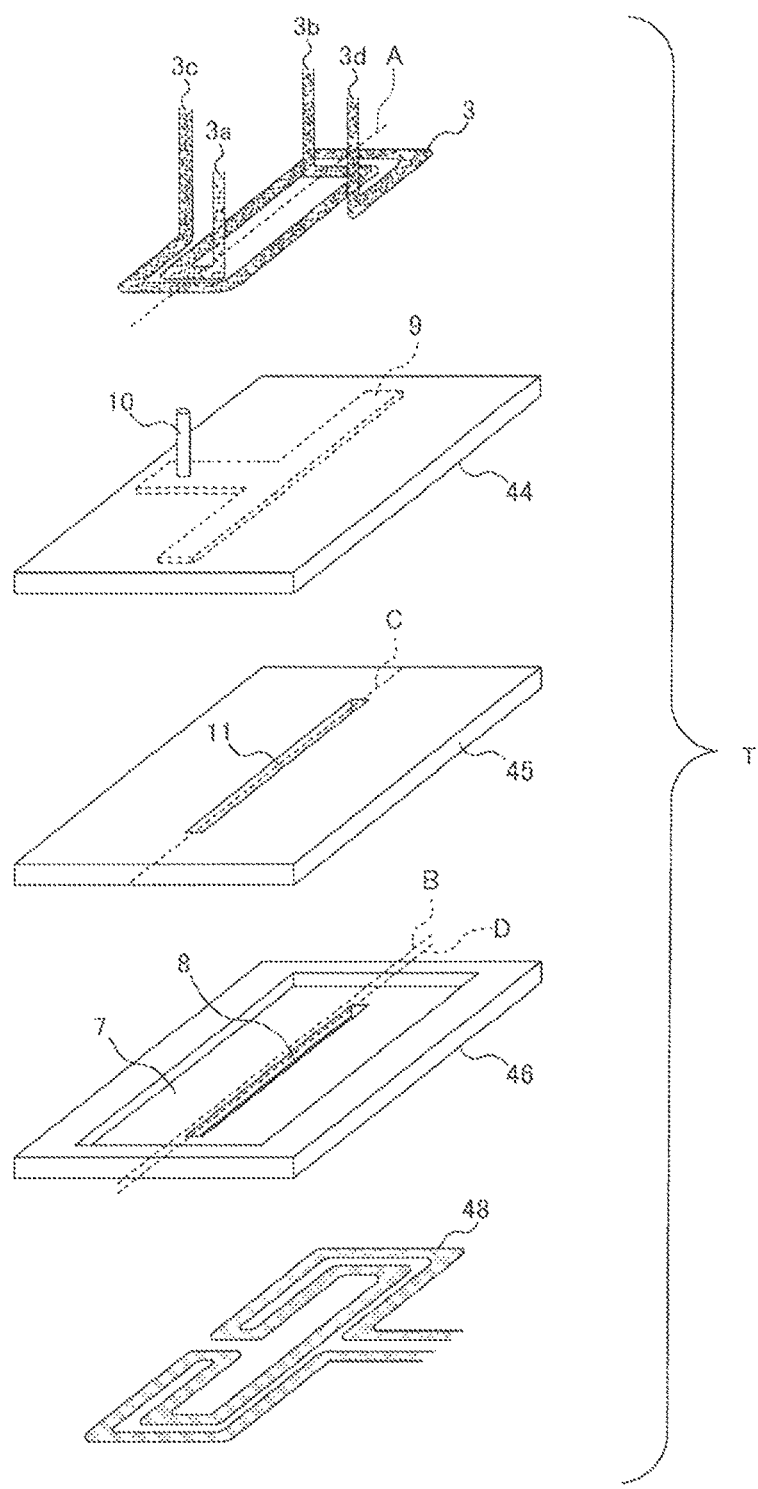
FIG. 37 is an exploded perspective view of a plasma processing apparatus according to the embodiment D1.

In addition, FIG. 37 is an exploded configuration view of the induction coupling-type plasma torch unit shown in FIG. 1, which also shows an array of perspective views of (a part of) the respective components.

As shown in FIG. 36A, the plasma processing apparatus of the embodiment D1 has the base material mounting table 1, the long chamber 53 disposed above the base material mounting table 1, the gas supply pipe 10 that introduces gas into the inside of the chamber 53, and the solenoid coil 3 disposed near the chamber 53. As shown in FIG. 37, the solenoid coil 3 surrounds the outer periphery of the chamber 53 in a manner in which a plurality of coil pieces that are shorter than the outer peripheral length of the chamber 53 mutually overlaps a part of the neighboring coil pieces.

A plurality of coil pieces preferably mutually overlaps a part of the neighboring coil pieces in a helix shape so as to surround the outer periphery of the chamber 53. In addition, a plurality of coil pieces preferably mutually overlap a part of the neighboring coil pieces so as to be disposed opposite to one surface of the outer periphery of the chamber 53 formed into a helix shape on the same plane.

The inner wall surface of the chamber 53 on a side near the solenoid coil 3 is preferably a plane in parallel with the plane that the solenoid coil 3 forms. This is because, in the above configuration, the distance from the solenoid coil 3 to the chamber 30 becomes the same at an arbitrary portion of the solenoid coil 3. That is, it becomes possible to generate induction coupling plasma using a small high-frequency electric power, and plasma can be efficiently generated.

As shown in FIG. 37, the chamber 53 is preferably configured as a space sandwiched by two dielectric plates having a groove on at least one of the second quartz plate 45 and the third quartz plate 46. This is because the above configuration enables easy manufacturing of a plasma processing apparatus.

The external form of the chamber 53 is preferably larger than the external form of the solenoid coil 3. This is because the plasma generation efficiency of the plasma processing apparatus becomes favorable since the above requirement relates to the fact that the distance from the solenoid coil 3 to the chamber 53 becomes the same at an arbitrary portion of the solenoid coil 3.

When the "depth of the chamber 53" is defined to be the "length of the chamber 53 in the depth direction with respect to the short direction and the longitudinal direction of the chamber 53 in the inside of the chamber 53", the depth of the chamber 53 is preferably 0.5 mm to 7 mm, and more preferably 1 mm to 5 mm. This is because the plasma generation efficiency of the plasma processing apparatus becomes favorable.

The plasma ejection port is preferably provided on the opposite side of the solenoid coil 3 in the chamber 53.

The orientation from the opening portion to the chamber and the orientation from the solenoid coil to the chamber are preferably mutually perpendicular. In addition, the solenoid coil is disposed so as to surround the chamber 53, and preferably forms a solenoid shape in general.

In the induction coupling plasma torch T, a multiple swirling-form planar solenoid coil 3 made of a conductor is disposed in the vicinity of the first quartz plate 44 and the second quartz plate 45. The solenoid coil 3 is constituted by two conductor pieces, each conductor piece alone does not form a one or more-turn circular shape, and the coils as a whole form an almost one or more-turn circular shape. In order to efficiently generate plasma, the coils are preferably configured so that a high-frequency electric current having the same phase flows in the peripheral direction in each conductor piece.

For example, it is possible to let a high-frequency electric current having the same phase flows in the peripheral direction by connecting the end portions 3a and 3b on the inner peripheral side of each conductor piece to a high-frequency power supply side (high voltage side), and connecting the end portions 3c and 3d on the outer peripheral side of each conductor piece to a grounding side. In contrast to the above, the end portions 3a and 3b on the inner peripheral side of each conductor piece may be connected to a grounding side, and the end portions 3c and 3d on the outer peripheral side of each conductor piece may be connected to a high-frequency power supply side (high voltage side).

The chamber 53 made of a dielectric material is demarcated by a space (the inside 7 of the chamber 53) surrounded by the second quartz plate 45 and the third quartz plate 46. The inner wall surface of the chamber 53 near the solenoid coil 3 is a plane in parallel with the plane formed by the solenoid coil 3. Since the above configuration makes the distance from the solenoid coil 3 to the chamber 53 the same at an arbitrary portion of the solenoid coil 3, it becomes possible to generate induction coupling plasma using a small high-frequency power, and plasma can be efficiently generated. In addition, the external form of the chamber 53 is configured to be larger than the external form of the solenoid coil 3. The above configuration makes the distance from the solenoid coil 3 to the chamber 53 the same at an arbitrary portion of the solenoid coil 3. As a result, the plasma generation efficiency of the plasma processing apparatus becomes favorable.

The induction coupling-type plasma torch unit T is surrounded by a wholly grounded shielding member (not shown) made of a conductor so that the leakage (noise) of high frequencies can be effectively prevented, and an abnormal discharge and the like which are not preferable can be effectively prevented.

The inside 7 of the chamber 53 is surrounded by a plane that forms a single surface of the second quartz plate 45 and the recess portion (groove) provided in the third quartz plate 46. That is, the entire chamber 53 is surrounded by a dielectric material. Plasma generated in the inside 7 of the chamber 53 is ejected toward the base material 2 from the plasma ejection port 8 which acts as a slit-shaped opening portion in the chamber 53. In addition, the longitudinal direction of the chamber 53 and the longitudinal direction of the plasma ejection port 8 are disposed in parallel. In addition, the plasma ejection port 8 is preferably provided on the opposite side of the solenoid coil 3 in the chamber 53.

A plasma gas manifold 9 surrounded by the recess portion (groove) provided in the first quartz plate 44 and the plane (the surface on the opposite side of the chamber 53) that forms a single surface of the second quartz plate 45 is provided. Gas supplied to the plasma gas manifold 9 from the plasma gas supply pipe 10 is introduced into the inside 7 of the chamber 53 through a plasma gas supply hole 11 which acts as a long gas introduction portion provided in the second quartz plate 45. The above configuration can easily realize a uniform gas flow in the longitudinal direction. The flux of gas introduced into the plasma gas supply pipe 10 is controlled using a flux control apparatus such as a mass flow controller provided upstream.

The plasma gas supply hole 11 is a long slit, but a plurality of the plasma gas supply holes having a round hole shape may be provided.

The solenoid coil 3 is adhered (joined) to the first quartz plate 44 using an adhesive. In addition, the central axis of the solenoid coil 3 is disposed in parallel with the longitudinal direction of the chamber 53 and the longitudinal direction of the plasma ejection port 8.

In addition, a line which is parallel with the longitudinal direction of the solenoid coil 3 and penetrates through the center of the solenoid coil 3 (the dotted line A in FIG. 37), a line which is parallel with the longitudinal direction of the chamber 53 and penetrates through the center of the chamber 53 (the dotted line B in FIG. 37), a line which is parallel with the longitudinal direction of the plasma gas supply hole 11 and penetrates through the center of the plasma gas supply hole 11 (the dotted line C in FIG. 37), and a line which is parallel with the longitudinal direction of the plasma ejection port 8 and penetrates through the center of the plasma ejection port 8 (the dotted line D in FIG. 37) are preferably disposed in parallel with one another on the same plane. Since the above configuration can provide uniform plasma and minimize the volume of portions in which plasma is generated, the plasma generation efficiency improves.

In addition, a shielding gas nozzle 13 is disposed as a shielding gas supply opening at a portion near the base material mounting table 1, and a shielding gas manifold 14 is provided in the shielding gas nozzle. As such, a two-path gas introduction system is prepared, and a shielding gas separately from plasma gas which is suitable for generation of plasma is supplied so that the incorporation of gas which is not necessary for or has an adverse influence on the treatment, such as oxygen and carbon dioxide in the atmosphere, into plasma-irradiating surfaces can be decreased. Meanwhile, the shielding gas supply opening may be a slit having a long shape in parallel with the longitudinal direction of the plasma ejection port 8. In addition, the shielding gas supply opening may be a plurality of holes arrayed in parallel with the longitudinal direction of the plasma ejection port 8.

The solenoid coil 3 is hollow, and the inside thereof forms a cooling medium path. That is, in the inside of the solenoid coil 3, cooling water flows as a cooling medium so that the solenoid coil 3 is cooled, and the first quartz plate 44 joined to the solenoid coil is cooled. In addition, a water cooling tube 48 made of a conductor which acts as the cooling medium path is joined to the third quartz plate 46 using the adhesive. The water cooling tube 48 is electrically grounded, and is configured to facilitate ignition (lighting) of plasma.

The first quartz plate 44, the second quartz plate 45, and the third quartz plate 46 are preferably adhered (joined) to one another. This is because it is possible to effectively cool the induction coupling-type plasma torch unit by mutually increasing thermal conductivity.

Joining of the solenoid coil 3 and the first quartz plate 44, joining of the water cooling tube 48 and the third quartz plate 46, joining of the first quartz plate 44 and the second quartz plate 45, and joining of the second quartz plate 45 and the third quartz plate 46 can be performed using a variety of adhesives as well as a welding method. In order to secure the cooling efficiency, in a case in which an adhesive is used, the adhesive is preferably coated as thinly and uniformly as possible.

The advantage of the configuration in which the solenoid coil 3 and the water cooling tube 48 are joined to the first quartz plate 44 and the third quartz plate 46 respectively is that the existing plate materials and tube materials can be used, and therefore the plasma processing apparatus can be manufactured at low costs within a short period of time. In addition, since the distance between the chamber and the cooling medium path can be decreased, the cooling efficiency is favorable. That is, since the cross section of the cooling medium path is round, compared to the case of the technique described in Patent Document 6 in the examples of the related art in which cooling is performed in a double tube configuration, in the embodiment, it is possible to let a far larger amount of a cooling medium flow, and to effectively cool the chamber.

The rectangular slit-shaped plasma ejection port 8 is provided, and the base material mounting table 1 (or the base material 2 on the base material mounting table 1) is disposed opposite to the plasma ejection port 8. In this state, gas is supplied into the chamber 53. At the same time, a high-frequency electric power is supplied to the solenoid coil 3 from a high-frequency power supply (not shown) while gas is ejected toward the base material 2 from the plasma ejection port 8. In addition, plasma is generated in the inside 7 of the chamber 53. Thereby, the base material 2 is irradiated with plasma from the plasma ejection port 8 so that a plasma processing can be performed on a thin film 22 on the base material 2. The base material 2 is preferably treated by relatively moving the chamber 53 and the base material mounting table 1 perpendicularly with respect to the longitudinal direction of the plasma ejection port 8. That is, the induction coupling-type plasma torch unit T or the base material mounting table 1 is preferably moved in the horizontal direction in FIG. 36A and in the perpendicular direction to the paper surface of FIG. 36B. This is because it is possible to perform a treatment of a large-scale substrate or the like within a short period of time without increasing the size of the plasma processing apparatus.

As such, it is preferable to make the chamber 53 and the base material mounting table 1 relatively movable perpendicularly with respect to the longitudinal direction of the plasma ejection port 8 while the longitudinal direction of the plasma ejection port 8 and the base material mounting table 1 are disposed in parallel. This is because it is possible to configure the apparatus so that the length of the plasma to be generated and the treatment length of the base material 2 become almost the same. In addition, the width of a cross section of the chamber 53 cut at a surface perpendicular to the central axis of the chamber (the width of the inside 7 of the chamber 53 in FIG. 36A) may be slightly larger than the width of the plasma ejection port 8 (the width of the gap in FIG. 36A). That is, the volume of plasma to be generated can be extremely decreased compared to in the related art. As a result, the power efficiency significantly increases.

As shown in FIGS. 36A and 36B, when the "depth of the chamber 53" is defined to be the "length of the chamber 53 in the depth direction Z with respect to the short direction X and longitudinal direction Y of the chamber 53 in the inside 7 of the chamber 53", the "depth of the chamber 53" corresponds to "d". In a test performed under the atmosphere with the length L of the inside 7 of the chamber 53 in the longitudinal direction Y set to 95 mm and the depth d of the chamber 53 being varied, generation of thermal plasma using Ar gas was successful at a high-frequency electric power of 10 kW or less when the depth d of the chamber 53 was 1 mm to 5 mm. It is considered that, when the high-frequency electric power is further increased, thermal plasma is generated even at a depth d of the chamber 53 of 0.5 mm to 7 mm, however, outside the above range, an induction-coupling plasma processing at atmospheric pressure is difficult.

From the test results, it can be said that the depth d of the chamber is desirably 0.5 mm to 7 mm, and, more preferably, the depth d of the chamber is desirably 1 mm to 5 mm. The above fact indicates that the volume of the inside 7 of the chamber 53 may be small, and it is considered that a high power efficiency can be obtained compared to in the related art.

In addition, in the embodiment D1, the multiple swirling-form solenoid coil 3 was used. Hereinafter, advantages thereof will be described. When the impedance of the coil is not five times or less, preferably twice or less the characteristic impedance (generally, a characteristic impedance of 50Ω is used) of a cable connecting the high-frequency power supply and a matching circuit (provided between the high-frequency power supply and the coil), it is difficult to obtain a favorable matching state. In a case in which a large-scale base material 2 needs to be treated, that is, in a case in which the treatment length (for example, the length or diameter of the short side of the base material 2) of the base material 2 increases, it is necessary to increase the length of the solenoid coil in the longitudinal direction in accordance with the increase in the treatment length. However, in a case in which a simple swirling-form solenoid coil is sued, the impedance (in proportion to impedance) of the coil increases as the length of the coil increases, and it becomes difficult to obtain a favorable matching state.

Meanwhile, in the embodiment D1, the multiple swirling-form solenoid coil 3 is used. The solenoid coil 3 is constituted by two conductor pieces. Each conductor piece alone does not form a one or more-turn circular shape, and the coils as a whole form an almost one or more-turn circular shape. In addition, high-frequency power is configured to be supplied to the respective conductor pieces in parallel. Since each conductor piece alone does not form a one or more-turn circular shape, the electric current path becomes shorter than the simple swirling-form solenoid coil (it is necessary to configure at least a one or more-turn circular shape). Furthermore, since the conductor pieces are connected to each other in parallel, an extremely small impedance is formed in the overall solenoid coil 3.

Thereby, even in a case in which the treatment length (for example, the length or diameter of the short side of the base material 2) of the base material 2 increases, a favorable matching state is obtained, and a low impedance coil can be realized. Meanwhile, the coil preferably forms a one or more-turn circular shape as a whole. This is because a low impedance coil is essential for generation of high-temperature induction coupling plasma.

(Embodiment D2)

Figure 38:
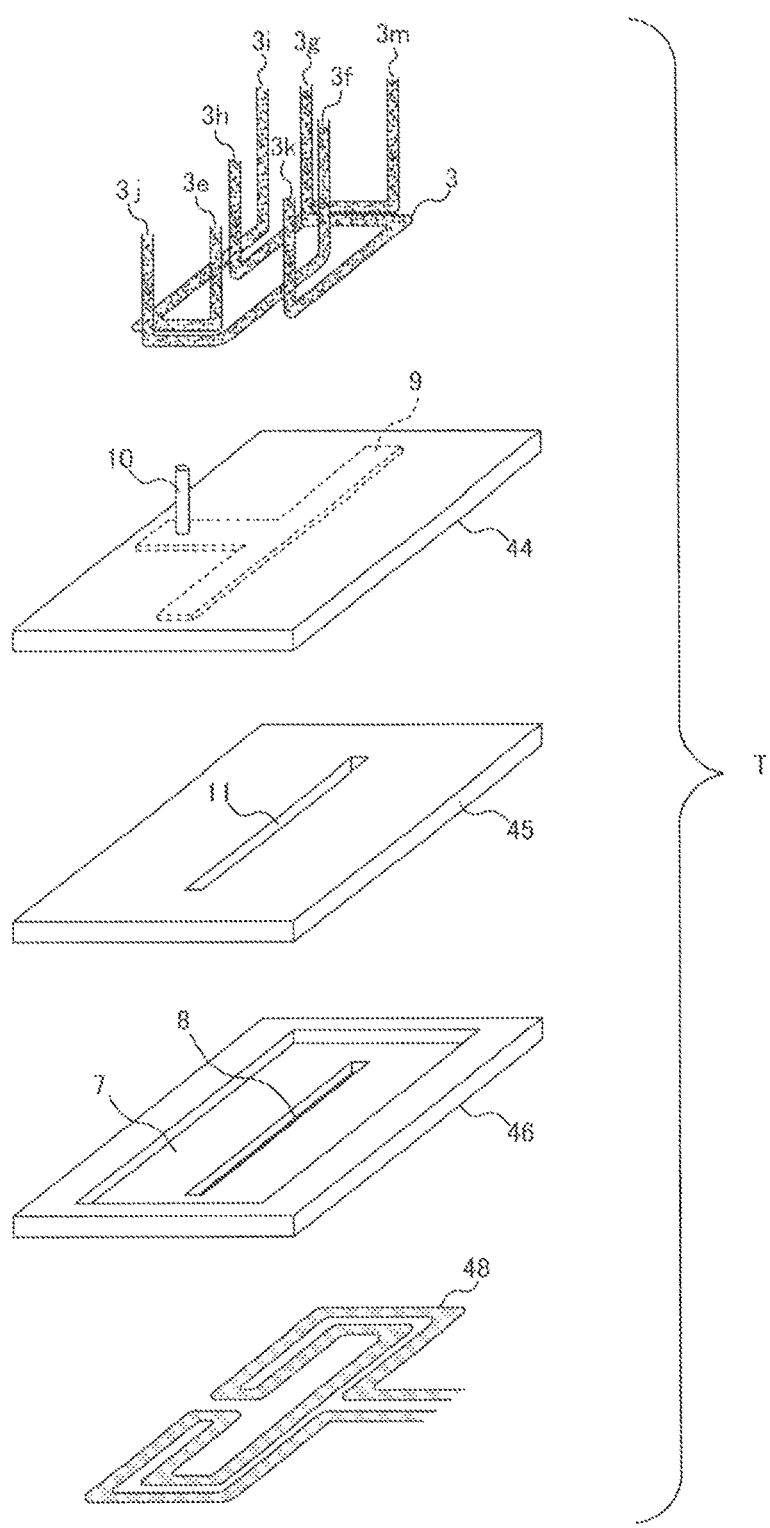
FIG. 38 is an exploded perspective view of a plasma processing apparatus according to an embodiment D2.

Hereinafter, the embodiment D2 will be described with reference to FIGS. 38, 39A to 39C. FIG. 38 is an exploded configuration view of an induction coupling-type plasma torch unit of a plasma processing apparatus of an embodiment D2, which also shows an array of perspective views of (a part of) the respective components.

In FIG. 38, the multiple swirling-form planar solenoid coils 3 made of a conductor is disposed in the vicinity of the first quartz plate 44 and the second quartz plate 45. The solenoid coil 3 is constituted by four conductor pieces, each conductor piece alone does not form a one or more-turn circular shape, and the coils as a whole form an almost one or more-turn circular shape. In order to efficiently generate plasma, the coils are preferably configured so that a high-frequency electric current having the same phase flows in the peripheral direction in each conductor piece.

For example, it is possible to let a high-frequency electric current having the same phase flows in the peripheral direction by connecting the end portions 3e, 3f, 3g, and 3h on the inner peripheral side of each conductor piece to a high-frequency power supply side (high voltage side), and connecting the end portions 3i, 3j, 3k, and 3m on the outer peripheral side of each conductor piece to a grounding side. In contrast to the above, the end portions 3e, 3f, 3g, and 3h on the inner peripheral side of each conductor piece may be connected to a grounding side, and the end portions 3i, 3j, 3k, and 3m on the outer peripheral side of each conductor piece may be connected to a high-frequency power supply side (high voltage side).

The above configuration makes the length of the respective conductor pieces (the length of the electric current path) shorter than in the embodiment D1, and it is possible to further reduce the impedance.

Figure 39A:
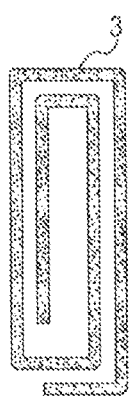
FIGS. 39A to 39C are planar views showing a coil according to the plasma processing apparatus according to the embodiment D1 respectively.
Figure 39B:
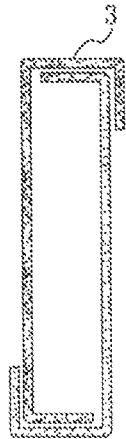
Figure 39C:

FIGS. 39A to 39C show planar views showing the configurations of the solenoid coils in the embodiments D1 and D2. FIG. 39A is a simple swirling-form solenoid coil 3. FIG. 39B is a multiple (double) swirling-form coil 3 using a substantially C-letter shape coil piece according to the embodiment D1. FIG. 39C is a multiple (quadruple) swirling-form coil 3 using a substantially L-letter shape coil piece according to the embodiment D2.

The above description exemplifies double and quadruple swirling-form solenoid coils 3, but it is also possible to use a solenoid coil having a multiplicity of triple, quintuple, or more.

(Embodiment D3)

Figure 40:
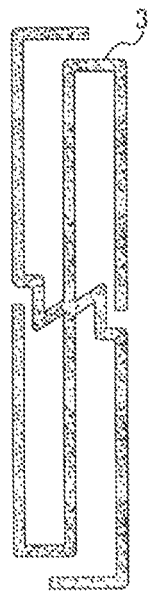
FIG. 40 is a planar view showing a coil of a plasma processing apparatus according to an embodiment D3.

FIG. 40 is a planar view of a solenoid coil in an embodiment D3. In FIG. 40, the multiple planar swirling-form solenoid coil 3 made of a conductor is used. The multiplicity of the coil is four. The solenoid coil 3 is constituted by four conductor pieces, each conductor piece alone does not form a one or more-turn circular shape, and the coils as a whole form an almost one or more-turn circular shape. In addition, the end portions on the inner peripheral sides of the respective conductor pieces are coupled at the center of the solenoid coil 3.

(Embodiment D4)

Figure 41:
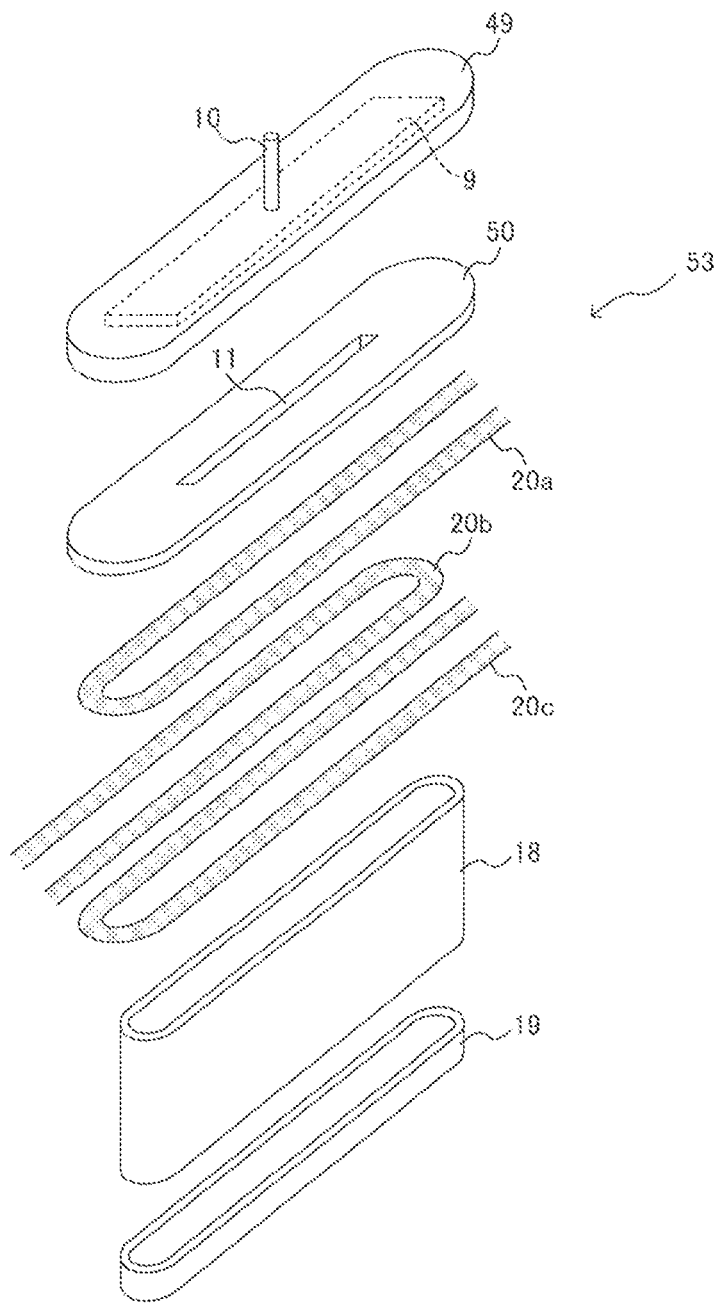
FIG. 41 is an assembled perspective view of a plasma processing apparatus according to the embodiment D4.

FIG. 41 is an assembly configuration view of an induction coupling-type plasma torch unit in a plasma processing apparatus according to an embodiment D4, which also shows an array of perspective views of (a part of) the respective components. In addition, FIG. 42 is a cross-sectional view of the induction coupling-type plasma torch unit cut at a surface perpendicular to the longitudinal direction.

Figure 42:
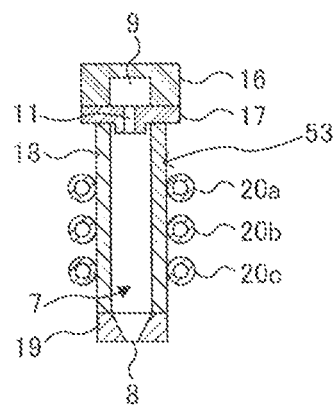
FIG. 42 is a planar view of a plasma processing apparatus according to the embodiment D4.

In FIGS. 41 and 42, the long chamber 53 made of a dielectric material is demarcated by a space (the inside 7 of the chamber 53) surrounded by the quartz plate 50 provided below the lid 16, the tubular quartz tube 18, and the tubular quartz nozzle 19 having a width-narrowing opening portion at one side. The bottom surface of the quartz tube 18 and the top surface of the quartz nozzle 19 are joined to each other without void in the circular shape. A multiple helix-shaped solenoid coil 20 (20a to 20c) made of a conductor is disposed around the quartz tube 18 so as to surround the chamber 53. The inner wall surface of the chamber 53 near the solenoid coil 20 constitutes a surface in parallel with the tubular shape constituted by the solenoid coil 20 as a whole.

The above configuration makes the distance from the solenoid coil 20 to the chamber 53 the same at an arbitrary portion of the solenoid coil 20. As a result, it becomes possible to generate induction coupling plasma using a small high-frequency power, and plasma can be efficiently generated. The solenoid coil 20 is constituted by three U-letter shape conductor pieces 20a, 20b, and 20c, each conductor piece alone does not form a one or more-turn circular shape, and the coils as a whole form an almost three-turn circular shape. In order to efficiently generate plasma, the coils are preferably configured so that a high-frequency electric current having the same phase flows in the peripheral direction in each conductor piece.

The induction coupling-type plasma torch unit T is preferably surrounded by a wholly grounded shielding member (not shown) made of a conductor. This is because the leakage (noise) of high frequencies can be effectively prevented, and an abnormal discharge and the like which are not preferable can be effectively prevented.

The inside 7 of the chamber 53 is surrounded by the quartz plate 17, the quartz tube 18, and the quartz nozzle 19. That is, the entire chamber 53 is surrounded by a dielectric material. Plasma generated in the inside 7 of the chamber 53 is ejected toward the base material from the plasma ejection port 8 which acts as a slit-shaped opening portion (the opening portion having a narrow width which is provided below the quartz nozzle 19) in the chamber 53. In addition, the longitudinal direction of the chamber 53 and the longitudinal direction of the plasma ejection port 8 are disposed in parallel.

A plasma gas manifold 9 surrounded by the recess portion (groove) provided in a lid 49 and the plane (the surface on the opposite side of the chamber 53) that forms a single surface of the quartz plate 17 is provided. Gas supplied to the plasma gas manifold 9 from the plasma gas supply pipe 10 is introduced into the inside 7 of the chamber 53 through a plasma gas supply hole 11 (penetrating hole) which acts as a long gas introduction portion provided in the quartz plate 17. The above configuration can easily realize a uniform gas flow in the longitudinal direction. The flux of gas introduced into the plasma gas supply pipe 10 is controlled using a flux control apparatus such as a mass flow controller provided upstream.

The plasma gas supply hole 11 is a long slit, but a plurality of the plasma gas supply holes having a round hole shape may be provided.

The central axis of the solenoid coil 20 is disposed so as to match the central axis of the chamber 53 and the central axis of the plasma ejection port 8.

In order to effectively cool the quartz tube 18, the solenoid coil 20 may be connected to the quartz tube 18, and a cooling medium such as cooling water may be made to flow in the hollow solenoid coil 20.

In addition, in the embodiment, a multiple helix-form solenoid coil 20 was used. Hereinafter, the advantages of the multiple spiral-form solenoid coil will be described. When the impedance of the coil is not five times or less, preferably twice or less the characteristic impedance (generally, a characteristic impedance of 50Ω is used) of a cable connecting the high-frequency power supply and a matching circuit (provided between the high-frequency power supply and the coil), it is difficult to obtain a favorable matching state. In a case in which a large-scale base material 2 needs to be treated, that is, in a case in which the treatment length (for example, the length or diameter of the short side of the base material 2) of the base material 2 increases, the length of the solenoid coil in the longitudinal direction is preferably increased in accordance with the increase in the treatment length.

However, in a case in which a simple helix-form solenoid coil is sued, the impedance (in proportion to impedance) of the coil increases as the length of the coil increases, and it becomes difficult to obtain a favorable matching state. Meanwhile, in the embodiment, the multiple helix-form solenoid coil 20 is used. The solenoid coil 20 is constituted by three U-letter shape conductor pieces. Each conductor piece alone does not form a one or more-turn circular shape, and the coils as a whole form an almost one or more-turn circular shape. In addition, high-frequency power is configured to be supplied to the respective conductor pieces in parallel. Since each conductor piece alone does not form a one or more-turn circular shape, the electric current path becomes shorter than the simple helix-form solenoid coil (it is necessary to configure at least a one or more-turn circular shape).

Furthermore, since the conductor pieces are connected to each other in parallel, an extremely small impedance is formed in the overall solenoid coil 20. Thereby, even in a case in which the treatment length (for example, the length or diameter of the short side of the base material 2) of the base material 2 increases, a favorable matching state is obtained, and a low impedance coil can be realized. Meanwhile, the coil preferably forms a one or more-turn circular shape as a whole. This is because a low impedance coil is essential for generation of high-temperature induction coupling plasma.

(Embodiment D5)

Figure 43:
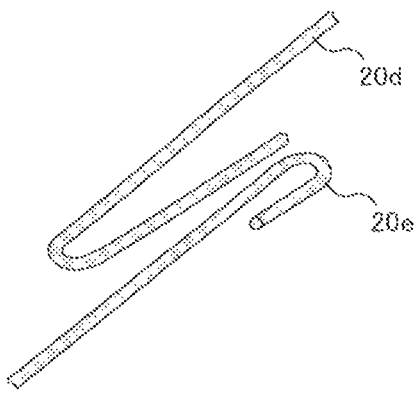
FIG. 43 is a planar view of a plasma processing apparatus according to an embodiment D5.

FIG. 43 is a perspective view of a solenoid coil in an embodiment D5. In FIG. 43, the solenoid coil 20 is constituted by two conductor pieces 20*d* and 20*e*, each conductor piece alone does not form a one or more-turn circular shape, and the coils as a whole form an almost one or more-turn circular shape. The conductor pieces 20*d* and 20*e* are disposed at vertically slightly separated locations.

(Embodiment D6)

Figure 44:
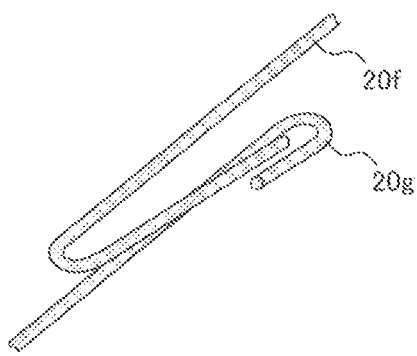
FIG. 44 is a planar view of a plasma processing apparatus according to an embodiment D6.

FIG. 44 is a perspective view of a solenoid coil in an embodiment D6. In FIG. 44, the solenoid coil 20 is constituted by two conductor pieces 20*f* and 20*g*, each conductor piece alone does not form a one or more-turn circular shape, and the coils as a whole form an almost one or more-turn circular shape. The conductor pieces 20*f* and 20*g* are disposed at vertically little separated locations.

The above description exemplifies double and triple helix-form solenoid coils 20, but it is also possible to use a solenoid coil having a multiplicity of quadruple or more.

In addition, a case in which the solenoid coil 20 has a planar shape has been exemplified, the solenoid coil 20 may not be necessarily a plane. For example, the plasma processing apparatus may has a configuration in which a so-called a hanging bell-type solenoid coil in which the distance between the solenoid coil 20 and the first quartz plate 44 gradually increases toward the central portion of the swirl is used.

In addition, a case in which the plasma ejection port 8 is provided on the opposite side of the solenoid coil 20 in the chamber 53 has been exemplified, but the plasma processing apparatus may has a configuration in which the orientation from the plasma ejection port 8 to the chamber 53 and the orientation from the solenoid coil 3 to the chamber 53 are mutually perpendicular.

Other Embodiments

The plasma processing apparatuses and the plasma processing methods described above simply exemplify the typical examples within the scope of the application of the invention.

For example, the induction coupling-type plasma torch unit T may be scanned against the fixed base material mounting table 1, but the base material mounting table 1 may also be scanned against the fixed induction coupling-type plasma torch unit T.

In addition, using a variety of the configurations of the invention, it becomes possible to treat the vicinity of the surface of the base material 2 at a high temperature. Therefore, the invention can be applied to the crystallization of a TFT semiconductor film or the modification of a solar cell semiconductor film which has been described in detail in the examples of the related art, and, additionally, can be applied to a variety of surface treatments such as the cleaning or degassing reduction of a protective layer in a plasma display panel, the surface flattening or degassing reduction of a dielectric layer composed of a collection of silica fine particles, the reflow of a variety of electric devices, and plasma doping using a solid impurity source. In addition, as a method of manufacturing a solar cell, the invention can also be applied to a method in which powder obtained by crushing a silicon ingot is coated on a base material, and melted by irradiating plasma, thereby obtaining a polycrystalline silicon film.

In addition, use of an ignition source is also possible in order to facilitate the ignition of plasma. As the ignition source, an ignition spark apparatus which is used in a gas water heater or the like can be used.

In addition, a term of "thermal plasma" has been used in the description for simplicity, but it is difficult to strictly differentiate thermal plasma and low-temperature plasma. In addition, for example, as described in "Non-equilibrium in thermal plasma", Yasunori Tanaka, Journal of Plasma and Fusion Research, Vol. 82, No. 8 (2006), pp. 479 to 483, it is also difficult to differentiate the kinds of plasma using only thermal equilibrium. An object of the invention is a treatment of a base material, and the invention can be applied to matters relating to techniques that irradiate high-temperature plasma regardless of terminologies such as thermal plasma, thermal equilibrium plasma, and high-temperature plasma.

In addition, a case in which the vicinity of the surface of the base material is uniformly treated thermally at a high temperature only within an extremely short period of time has been exemplified, the invention can be applied even to a case in which a low-temperature plasma processing is performed on a base material by irradiating plasma from reaction gas or plasma and a reaction gas flow at the same time to the base material. When the reaction gas is mixed with the plasma gas, the base material is irradiated with plasma from the reaction gas, and etching or CVD can be realized. Alternatively, it is also possible to irradiate plasma and a reaction gas flow to a base material at the same time, and realize a plasma processing such as etching, CVD, or doping by using a noble gas or a gas obtained by adding a small amount of $H_2$ gas to a noble gas as the plasma gas, and supplying a gas including the reaction gas as the shielding gas.

When a gas mainly including argon gas is used as the plasma gas, as described in detail in the examples, thermal plasma is generated. Meanwhile, when a gas mainly including helium gas is used as the plasma gas, it is possible to generate plasma having a relatively low temperature. Using such a method, a treatment such as etching or film formation becomes possible without heating a base material too much.

Examples of the reaction gas used for etching include halogen-containing gases such as $C_xF_y$ (x and y are natural numbers) and $SF_6$, and it is possible to perform etching of silicon or a silicon compound. When $O_2$ is used as the reaction gas, removal of an organic substance, resist ashing, and the like become possible. Examples of the reaction gas used for CVD include monosilane, disilane, and the like, and formation of a silicon or silicon compound film becomes possible. Alternatively, when a gas mixture of an organic gas including silicon represented by tetraethoxysilane (TEOS) and $O_2$ is used, it is possible to form a silicon oxidized film.

Additionally, a variety of low-temperature plasma processing such as a surface treatment that modifies water repellency or hydrophilic properties are possible. When compared to a technique of the related art (for example, the technique described in Patent Document 7), since the invention is an induction coupling type so that it is difficult to transit to an arc discharge even when a high power density per unit volume is injected, and, consequently, a fast reaction rate is obtained, and it becomes possible to treat all of desired regions to be treated of a base material can be treated within a short period of time.

INDUSTRIAL APPLICABILITY

As described above, the invention can be applied to crystallization of a TFT semiconductor film or the modification of a solar cell semiconductor film. Needless to say, in a variety of surface treatments such as the cleaning or degassing reduction of a protective layer in a plasma display panel, the surface flattening or degassing reduction of a dielectric layer constituted by a collection of silica fine particles, the reflow of a variety of electric devices, and plasma doping using a solid impurity source, the invention is useful to treat all of desired regions to be treated of a base material within a short period of time by generating plasma stably and efficiently when the vicinity of the surface of the base material is uniformly treated thermally at a high temperature only within an extremely short period of time.

In addition, the invention is useful to efficiently treat all of desired regions to be treated of a base material within a short period of time in a low-temperature plasma processing such as etching, film formation, doping, or surface modification when a variety of electronic devices and the like are manufactured.

The present application claims priorities based on Japanese Patent Applications previously filed by the same applicants, that is, Japanese Patent Application No. 2011-266589 (filed on Dec. 6, 2011), Japanese Patent Application No. 2011-267960 (filed on Dec. 7, 2011), Japanese Patent Application No. 2011-267961 (filed on Dec. 7, 2011), and Japanese Patent Application No. 2011-235766 (filed on Oct. 27, 2011), the contents thereof are incorporated herein by reference.

REFERENCE SIGNS LIST

1 BASE MATERIAL MOUNTING TABLE
2 BASE MATERIAL
T INDUCTION COUPLING-TYPE PLASMA TORCH UNIT
3 SOLENOID COIL (COIL)
4 OUTSIDE DIELECTRIC BLOCK
5 INSIDE DIELECTRIC BLOCK
7 INSIDE (SPACE IN CHAMBER)
8 PLASMA EJECTION PORT
9 PLASMA GAS MANIFOLD
10 PLASMA GAS SUPPLY PIPE (GAS SUPPLY PIPE)
11 PLASMA GAS SUPPLY HOLE
13 SHIELDING GAS NOZZLE
14 SHIELDING GAS MANIFOLD
15, 21 COOLING MEDIUM PATH
16 GROUNDED COPPER PLATE
22 THIN FILM
30 CHAMBER

The invention claimed is:
1. A plasma processing apparatus comprising:
a chamber that defines an annular loop-shape space communicating with an opening portion having a long and linear shape, plasma being generated in the annular loop-shape space;
a gas supply pipe for introducing gas into an inside of the chamber;
a coil provided in a vicinity of the chamber and disposed at an outer periphery of the annular loop-shape space via an outside dielectric block;
a high-frequency power supply connected to the coil;
a base material mounting table that mounts a base material; and
a moving mechanism that allows relative movement between the chamber and the base material mounting table in a perpendicular direction with respect to an longitudinal direction of the opening portion,
wherein the chamber has the outside dielectric block and an inside dielectric block that is inserted into the outside dielectric block, the annular loop-shape space is disposed between an outside wall surface of the inside dielectric block and an inside wall surface of the outside dielectric block, and the chamber configured between the outside wall surface of the inside dielectric block and the inside wall surface of the outside dielectric block includes a first chamber region, a second chamber region and a third chamber region that are arranged in such order from the gas supply pipe to the opening portion, and wherein each of the outside dielectric block and the inside dielectric block has a taper portion in the third chamber region, plasma flows into the opening portion via a path between the taper portions of the outside dielectric block and the inside dielectric block in the third chamber region, a width of the first chamber region being smaller than a width of the second chamber region, a width of the third chamber region being smaller than a width of the second chamber region, the width of each of the first, second and third chamber regions being defined as a distance between the outside wall surface of the inside dielectric block and the inside wall surface of the outside dielectric block whose wall surfaces face each other, and the taper portion of the outside dielectric block and the taper portion of the inside dielectric block are bent in a same direction.

2. The plasma processing apparatus according to claim 1, wherein a cooling medium path is provided in parallel with a longitudinal direction of the opening portion in the inside of the chamber.

3. The plasma processing apparatus according to claim 1, wherein a cooling medium path in parallel with a longitudinal direction of the opening portion is provided within the inside dielectric block.

4. The plasma processing apparatus according to claim 1, wherein an outer diameter of the chamber is 10 mm or more.

5. The plasma processing apparatus according to claim 1, wherein the path is provided in parallel with a longitudinal direction of the opening portion.

6. The plasma processing apparatus according to claim 1, further comprising:
a shielding gas nozzle disposed as a shielding gas supply opening at a position between the chamber and the base material mounting table for supplying a shielding gas separately from plasma.

7. The plasma processing apparatus according to claim 6, wherein the shielding gas supply opening is configured as a slit shape or a plurality of holes provided in parallel with the longitudinal direction of the opening portion.

* * * * *